US 9,537,519 B2

United States Patent
El-Hassan et al.

(10) Patent No.: US 9,537,519 B2
(45) Date of Patent: Jan. 3, 2017

(54) SYSTEMS AND METHODS FOR PERFORMING POWER AMPLIFIER BIAS CALIBRATION

(71) Applicant: Apple Inc., Cupertino, CA (US)

(72) Inventors: Wassim El-Hassan, Cupertino, CA (US); Gurusubrahmaniyan Subrahmaniyan Radhakrishnan, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 14/525,077

(22) Filed: Oct. 27, 2014

(65) Prior Publication Data

US 2016/0072530 A1    Mar. 10, 2016

Related U.S. Application Data

(60) Provisional application No. 62/047,482, filed on Sep. 8, 2014.

(51) Int. Cl.
*H04B 1/40* (2015.01)
*H04B 1/04* (2006.01)
(Continued)

(52) U.S. Cl.
CPC .......... *H04B 1/0475* (2013.01); *H03F 1/0227* (2013.01); *H03F 1/0266* (2013.01);
(Continued)

(58) Field of Classification Search
CPC ....... H04B 1/40; H04B 11/3822; H04B 1/406; H04B 1/44; H04B 1/54; H04B 1/48; H04B 1/18; H04B 1/0475
(Continued)

(56) References Cited

U.S. PATENT DOCUMENTS 8,699,620 B1 * 4/2014 Wu .......................... H04N 7/52
375/254
8,824,981 B2  9/2014 Langer et al.
(Continued)

FOREIGN PATENT DOCUMENTS

EP        1986331       1/2013
WO        2014033661    3/2014

*Primary Examiner* — Nhan Le
(74) *Attorney, Agent, or Firm* — Treyz Law Group, P.C.; Michael H. Lyons

(57) ABSTRACT

Wireless communications circuitry in an electronic device may include power amplifier circuitry that is powered using a bias voltage supplied by adjustable power supply circuitry. The power supply circuitry may include envelope tracking circuitry that continuously adjusts the bias voltage. The wireless communications circuitry may generate test signals and may generate performance metric data from the test signals. Processing circuitry may generate bias voltage calibration data based on the performance metric data and may provide the calibration data to the envelope tracking circuitry. After the calibration data has been generated, the envelope tracking circuitry may continuously select bias voltages to provide to the amplifier based on the magnitude of signals that are transmitted and the calibration data. By actively adjusting the bias voltage in this way, power consumption may be minimized without generating undesirable harmonics or other radio-frequency performance requirement violations.

19 Claims, 12 Drawing Sheets

(51) Int. Cl.
*H03F 1/02* (2006.01)
*H03F 1/32* (2006.01)
*H03F 3/19* (2006.01)
*H03F 3/24* (2006.01)
*H04B 17/00* (2015.01)
*H04B 17/13* (2015.01)

(52) U.S. Cl.
CPC ............ *H03F 1/3247* (2013.01); *H03F 3/19* (2013.01); *H03F 3/245* (2013.01); *H04B 17/0085* (2013.01); *H04B 17/13* (2015.01); *H03F 2200/102* (2013.01); *H03F 2200/451* (2013.01)

(58) Field of Classification Search
USPC ............ 455/77, 78, 114.2, 126, 127.1, 232.1,455/234.1, 240.1, 255–260, 313, 323, 334
See application file for complete search history.

(56) References Cited

U.S. PATENT DOCUMENTS

| | | |
|---|---|---|
| 2012/0200354 A1 | 8/2012 | Ripley et al. |
| 2013/0034139 A1* | 2/2013 | Khlat ............... H03F 1/0227 375/224 |
| 2014/0057684 A1 | 2/2014 | Khlat |

* cited by examiner

| SIGNAL POWER LEVEL | RG1 | BIAS VOLTAGE | DPD SETTINGS |
|---|---|---|---|
| $P_1$ | $RG1_1$ | 3.8V | $DPD_A$ |
| $P_2$ | $RG1_2$ | 2V | $DPD_B$ |
| $P_3$ | $RG1_3$ | 1.8V | $DPD_C$ |
| $P_4$ | $RG1_4$ | 1.0V | $DPD_D$ |
| ⋮ | ⋮ | ⋮ | ⋮ |

*FIG. 13*

SYSTEMS AND METHODS FOR PERFORMING POWER AMPLIFIER BIAS CALIBRATION

This application claims the benefit of provisional patent application No. 62/047,482, filed Sep. 8, 2014, which is hereby incorporated by reference herein in its entirety.

BACKGROUND

This relates generally to wireless communications circuitry, and more particularly, to electronic devices having wireless communications circuitry.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Portable electronic devices are often provided with wireless communications capabilities. For example, handheld electronic devices may use cellular telephone communications standards to communicate with cellular networks. Handheld electronic devices typically have small battery with a limited battery capacity that is used for performing wireless communications. Unless care is taken to consume power wisely, an electronic device with a small battery may exhibit unacceptably short battery life.

Electronic devices with wireless communications capabilities typically include amplifying circuits that are used to amplify the power of radio-frequency signals prior to wireless transmission. For example, a radio-frequency power amplifier may receive input signals having an input power level and generate corresponding output signals having an output power level. The radio-frequency power amplifier receives a power supply voltage that powers the radio-frequency amplifier.

The power supply voltage (sometimes referred to as a bias voltage) provided to the radio-frequency power amplifier can be continuously adjusted based on the voltage magnitude of transmit signals that are amplified by the power amplifier in a process sometimes referred to as envelope tracking When performing envelope tracking, the power supply voltage is reduced at times when the transmit signals have a relatively low magnitude (i.e., a relatively low modulation envelope magnitude) and is increased at times when the transmit signals have a relatively high magnitude (i.e., a relatively high modulation envelope magnitude) so that overall power consumption is reduced in the device while transmitting radio-frequency signals. However, if care is not taken, reduced power supply voltages provided to the amplifier while performing envelope tracking operations can be insufficient to ensure satisfactory radio-frequency performance of the power amplifier. When provided with an insufficient power supply voltage, the power amplifier can generate spectral regrowth at harmonics of a transmit frequency that can undesirably interfere with a receive frequency of the device.

It would therefore be desirable to be able to provide wireless communications circuitry with improved power management capabilities.

SUMMARY

A method for operating an electronic device having wireless communications circuitry and processing circuitry is provided. The wireless communications circuitry may include power amplifier circuitry that is powered by a bias voltage supplied by adjustable bias voltage generation circuitry. The adjustable bias voltage generation circuitry may include envelope tracking circuitry that continuously adjusts the bias voltage based on the voltage magnitude of signals to be transmitted by the wireless communications circuitry and based on bias voltage calibration data stored on the device.

Processing circuitry on the device (e.g., calibration software running on the processing circuitry) may instruct baseband processing circuitry in the wireless communications circuitry to transmit radio-frequency test signals. The test signals may be transmitted by sweeping through a number of different voltage magnitudes and using a number of different bias voltages. The test signals may be conveyed to radio-frequency transceiver circuitry having transmitter circuitry and feedback receiver circuitry. The transmitter circuitry may feed radio-frequency test signals to the power amplifier circuitry and the power amplifier circuitry may amplify the test signals. The feedback receiver circuitry may receive the amplified test signals.

The processing circuitry may instruct the baseband processing circuitry and/or the feedback receiver circuitry to gather performance metric data from the transmitted radio-frequency test signals (e.g., adjacent channel leakage ratio values, receive band noise values, amplifier compression values, output power levels, etc.). The processing circuitry may retrieve the gathered performance metric data from the wireless communications circuitry and may process the performance metric data to generate calibration data for the envelope tracking circuitry. The device may generate calibration data for any desired combination of transmit signal voltage magnitudes and any desired device operating conditions.

After the calibration data has been generated, the baseband processing circuitry may provide transmit data signals that are different from the test signals to the envelope tracking circuitry and to the radio-frequency transmitter circuitry. The envelope tracking circuitry may continuously select bias voltages to provide to the power amplifier circuitry based on the transmit data signals (e.g., based on the voltage magnitude of the transmit data signals) and based on the received calibration data. For example, the calibration data may identify a bias voltage to use for a particular voltage magnitude of the transmit data signals and the envelope tracking circuitry may use the identified bias voltage to power the power amplifier circuitry for amplifying those transmit data signals. By actively adjusting the bias voltage based on the calibration data and the transmit signals, the wireless communications circuitry may reduce power consumption in the device relative to devices that provide constant bias voltages without generating undesirable radio-frequency harmonics, adjacent channel leakage violations, or other undesirable radio-frequency performance violations.

If desired, the calibration data may include a calibration data structure having multiple entries. Each entry may include a corresponding power amplifier bias voltage and transmit signal voltage magnitude. If desired, the each entry may include a corresponding output power level. The envelope tracking circuitry may identify a desired output power level and may select the bias voltage of the entry corresponding to that desired output power level to the power amplifier.

If desired, the processing circuitry may organize (e.g., store) the retrieved performance metric data in a performance metric data structure having multiple entries. Each entry may have a corresponding output power level measured by the baseband processing circuitry, amplifier compression value measured by the feedback receiver circuitry, adjacent channel leakage ratio value measured by the baseband processing circuitry, digital predistortion coefficient values; and receive band noise floor value measured by the feedback receiver circuitry. The processing circuitry may process the data structure to generate entries for the calibration data structure (e.g., to populate the calibration data structures with entries that may be used by the envelope tracking circuitry to provide a suitable bias voltage for any desired transmit signal under a wide range of operating constraints).

For example, the processing circuitry may selecting a desired output power level and may filter out entries from the performance metric data structure having output power levels that are different from the selected output power level. The processing circuitry may select a power amplifier compression value and may filter out entries from the performance metric data structure having power amplifier compression values that are different from the selected power amplifier compression value. The processing circuitry may compare the retrieved performance metric data to a predetermined adjacent channel leakage ratio threshold level and may filter out entries from the performance metric data structure having an adjacent channel leakage ratio value that is greater than the predetermined adjacent channel leakage ratio threshold level. The processing circuitry may compare the retrieved performance metric data to a predetermined receive band noise floor threshold level and may filter out entries from the performance metric data structure having a receive band noise floor value that is greater than the predetermined receive band noise floor threshold level. Each entry in the performance metric data structure may include a corresponding bias voltage with which the radio-frequency signals were transmitted. The processing circuitry may select a minimum bias voltage from the performance metric data structure after filtering the data structure and may store that minimum bias voltage level as a given entry in the plurality of entries of the calibration data structure.

During normal device operations, the baseband processing circuitry may provide a first transmit signal to the adjustable bias voltage generation circuitry and the radio-frequency power amplifier circuitry and may subsequently provide a second transmit signal having a second signal magnitude that is, for example, less than the first signal magnitude. The adjustable power supply circuitry may generate a first bias voltage based on the first transmit signal and the stored calibration data and may provide the first bias voltage to the power amplifier circuitry while the power amplifier circuitry amplifies the first transmit signal. The first bias voltage identified by the calibration data may have a magnitude that is greater than the first signal magnitude by a first voltage margin. The adjustable power supply circuitry may generate a second bias voltage based on the second transmit signal and the calibration data and may provide the second bias voltage to the power amplifier circuitry while the power amplifier circuitry amplifies the second transmit signal. The second bias voltage may have a magnitude that is greater than the second signal magnitude by a second voltage margin and that is less than first voltage margin (e.g., because greater voltage margins may be required for higher transmit power levels than for lower transmit power levels in order to ensure satisfactory radio-frequency performance).

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

FIG. 13 shows an illustrative table of bias voltage calibration data containing power amplifier voltage bias settings for a variety of different transmit signal powers that may be used by wireless communications circuitry for performing power amplifier envelope tracking to reduce overall power consumption without sacrificing radio-frequency performance in accordance with an embodiment of the present invention.

DETAILED DESCRIPTION

This relates to wireless communications, and more particularly, to calibrating and operating wireless electronic devices to enhance power consumption efficiency while satisfying performance constraints.

Figure 1:
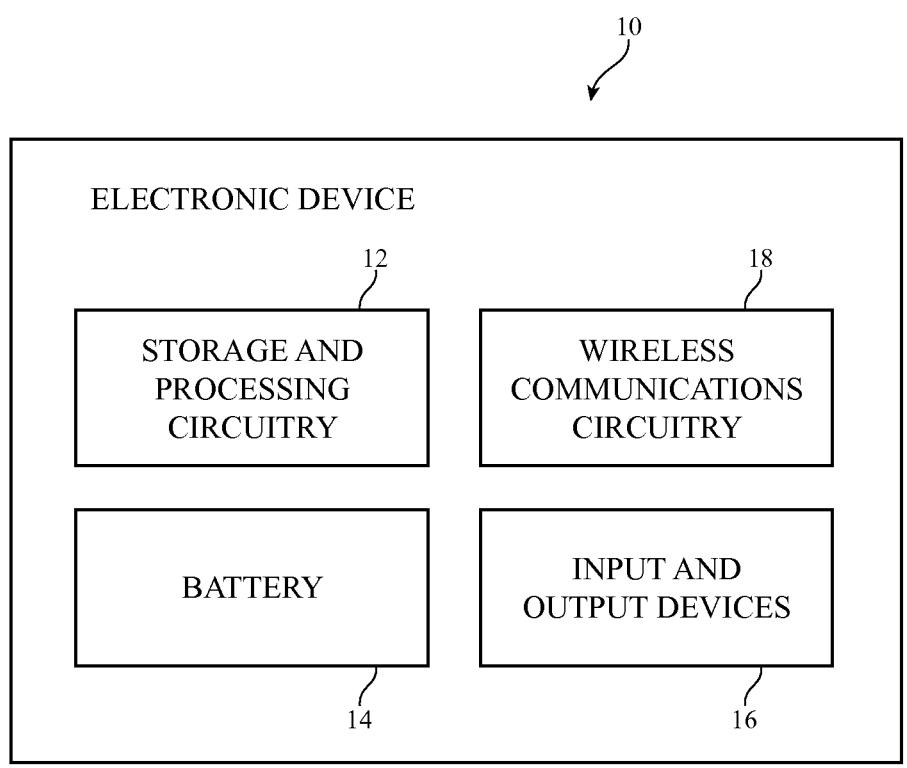
FIG. 1 is a diagram of an illustrative electronic device with wireless communications circuitry suitable for calibration in accordance with an embodiment of the present invention.

An illustrative wireless electronic device is shown in FIG. 1. Wireless electronic device 10 of FIG. 1 may be a cellular telephone, a tablet computer, a laptop computer, a desktop computer, a personal computer, a portable media player, other miniature and portable devices, or other electronic equipment.

As shown in FIG. 1, device 10 may include storage and processing circuitry 12. Storage and processing circuitry 12 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 12 may be used in controlling the operation of device 10. Processing circuitry in circuitry 12 may be based on processors such as microprocessors, microcontrollers, digital signal processors, dedicated processing circuits, power management circuits, audio and video chips, and other suitable integrated circuits.

Storage and processing circuitry 12 may be used to run software on device 10, such as internet browsing applications, voice-over-internet-protocol (VOIP) telephone call applications, email applications, media playback applications, operating system functions, etc. Storage and processing circuitry 12 may be used in implementing suitable communications protocols. Communications protocols that may be implemented using storage and processing circuitry 12 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 12 and/or input-output circuitry 16).

Device 10 may have one or more batteries such as battery 14. To minimize power consumption and thereby extend the life of battery 14, storage and processing circuitry 12 may be used in implementing power management functions for device 10. For example, storage and processing circuitry 12 may be used to adjust the power supply voltages that are used in powering the radio-frequency power amplifier circuitry. Whenever possible, these power amplifier bias voltages may be reduced to conserve power. If desired, storage and processing circuitry 12 may also be used to adjust the gain state of radio-frequency power amplifier circuitry on device 10 and may be used in adjusting the gain of a variable gain amplifier (VGA) that feeds output signals to the power amplifier circuitry. These adjustments may be made automatically in real time based on calibration data (sometimes referred to as calibration table data) stored on storage and processing circuitry 12 and control algorithms (software). For example, code may be stored in storage and processing circuitry 12 that configures storage and processing circuitry 36 to implement a control scheme in which operating settings are adjusted in accordance with calibration data to satisfy desired performance criteria such as desired transmit power levels, receive band noise levels, and adjacent channel leakage values while minimizing power consumption.

Input-output devices 16 may be used to allow data to be supplied to device 10 and to allow data to be provided from device 10 to external devices. Examples of input-output devices 16 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 16. Devices 16 may also be used to convey visual or sonic information to the user of device 10. Devices 16 may include connectors for forming data ports (e.g., for attaching external equipment such as computers, accessories, etc.).

Wireless communications devices 18 may include communications circuitry such as radio-frequency (RF) transceiver circuitry formed from one or more integrated circuits, power amplifier circuitry (e.g., power amplifier circuitry that is controlled by control signals from storage and processing circuitry 12 or other power supply circuitry to minimize power consumption while satisfying desired performance criteria), passive RF components, antennas, and other circuitry for handling RF wireless signals. Wireless signals can also be sent using light (e.g., using infrared communications).

Device 10 can communicate with external devices such as accessories, computing equipment, and wireless networks over wired and wireless communications paths. For example, accessories such as wired or wireless headsets may communicate with device 10. Device 10 may also be connected to audio-video equipment (e.g., wireless speakers, a game controller, or other equipment that receives and plays audio and video content), or a peripheral such as a wireless printer or camera. Device 10 may use a wired or wireless path to communicate with a personal computer or other computing equipment. The computing equipment may be, for example, a computer that has an associated wireless access point (router) or an internal or external wireless card that establishes a wireless connection with device 10. The computer may be a server (e.g., an Internet server), a local area network computer with or without Internet access, a user's own personal computer, a peer device (e.g., another portable electronic device 10), or any other suitable computing equipment. Device 10 can also communicate with wireless network equipment such as cellular telephone base stations and associated cellular towers, etc.

In typical circuit architectures, a transceiver circuit in wireless communications circuitry 18 may supply radio-frequency signals to the input of a power amplifier for transmission through an antenna. The power at which the power amplifier outputs radio-frequency signals (i.e., the output of the power amplifier) establishes an output power level for the power amplifier. The power at which the transceiver circuit provides radio-frequency signals to the power amplifier establishes an input power level for the power amplifier. The input power level may correspond to a voltage magnitude (amplitude) of the transmitted signals at the input of the power amplifier. The output power level may correspond to a voltage magnitude of the transmitted signals at the output of the power amplifier. Adjustments to the power amplifier may be made to adjust the power of radio-frequency signals transmitted by device 10 (e.g., to ensure a suitable wireless link is established and maintained with external wireless communications devices at various distances with respect to device 10).

The antenna structures and wireless communications devices of device 10 may support communications over any suitable wireless communications bands. For example, wireless communications circuitry 18 may be used to cover communications frequency bands such as cellular telephone voice and data bands at 850 MHz, 900 MHz, 1800 MHz, 1900 MHz, 2100 MHz, the Wi-Fi® (IEEE 802.11) bands at 2.4 GHz and 5.0 GHz (also sometimes referred to as wireless local area network or WLAN bands), the Bluetooth® band at 2.4 GHz, the global positioning system (GPS) band at 1575.42 MHz, etc.

Device 10 can cover these communications bands and other suitable communications bands with proper configuration of the antenna structures in wireless communications circuitry 18. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

The radio-frequency performance of wireless communications circuitry 18 in device 10 may be characterized by one or more wireless (radio-frequency) performance metrics. Device 10 (e.g., baseband processor circuitry in device 10, storage and processing circuitry 12, or calibration software running on device 10) may obtain data associated with wireless performance metrics (e.g., device 10 may generate performance metric data or may receive performance metric data measured for device 10 by external circuitry). For example, device 10 may obtain performance metric data associated with performance metrics such as received power, receiver sensitivity, receive band noise (e.g., a receive band noise floor voltage level), frame error rate, bit error rate, channel quality measurements based on received signal strength indicator (RSSI) information, adjacent channel leakage ratio (ACLR) information (e.g., ACLR information in one or more downlink frequency channels), channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information about how many re-transmissions are being requested over a cellular link between the electronic device and a cellular tower, information on whether a loss of signaling message has been received, information on whether paging signals have been successfully received, any desired combination of these performance metrics, and other information that is reflective of the performance of wireless circuitry 18 in device 10.

Other examples of radio-frequency performance metric data that may be obtained by device 10 include radio-frequency performance metric data associated with radio-frequency uplink (transmit) test signals that are transmitted by device 10 such as Error Vector Magnitude (EVM), output power, spectral parameters, Adjacent Channel Leakage Ratio (ACLR), performance metrics associated with radio-frequency power amplifier circuitry on device 10 such as amplifier compression and efficiency, etc. If desired, device 10 may obtain radio-frequency performance metric information associated with power amplifier circuitry in wireless circuitry 18 such as power amplifier compression information, power amplifier efficiency information, etc. Radio-frequency performance metrics associated with signals transmitted by device 10 may be generated by external wireless circuitry (e.g., an external test station) or by circuitry on device 10 that receives the transmitted signals via a wired feedback path coupled to the output of power amplifier circuitry in the device. In general, performance metric data may include data associated with any desired performance metric for the transmission or reception of radio-frequency signals by wireless communications circuitry 18. Performance metric data may, for example, include performance metric values measured for a given performance metric (e.g., measured error rate values, measured power level values, measured SNR values, measured ACLR values, measured receive band noise floor level values, measured RSSI values, etc.).

Figure 2:
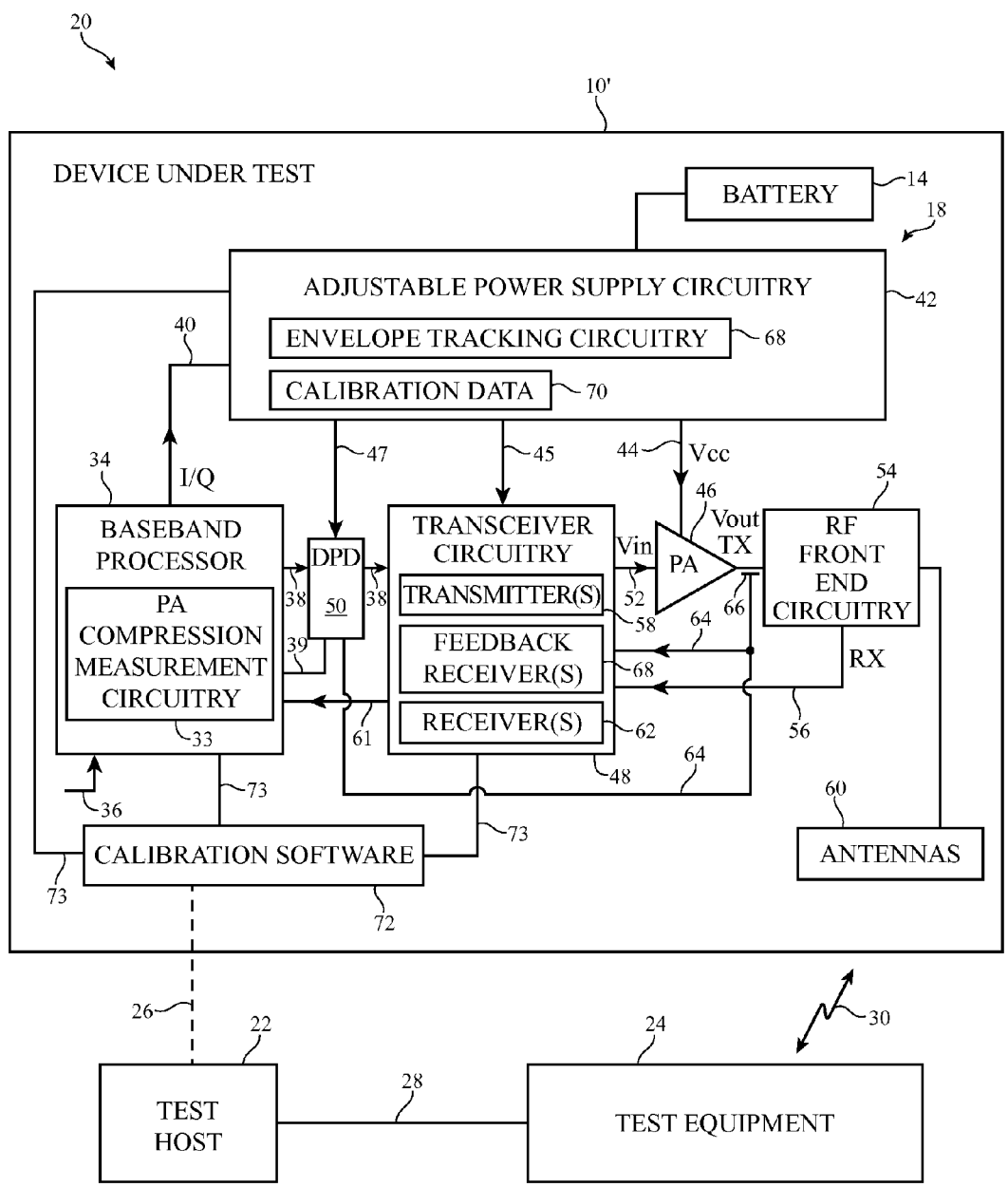
FIG. 2 is a circuit diagram of illustrative wireless communications circuitry having feedback receiver circuitry that may perform calibration operations for generating power amplifier bias voltage calibration data in accordance with an embodiment of the present invention.

Illustrative wireless communications circuitry that may be used in circuitry 18 of FIG. 1 is shown in FIG. 2. Device 10 may perform radio-frequency test and calibration operations to characterize and calibrate the radio-frequency performance of wireless communications circuitry 18 (e.g., using one or more radio-frequency performance metrics). Device 10 may perform calibration operations by gathering test data (e.g., radio-frequency performance metric data) associated with the wireless performance of device 10 and generating calibration data based on the gathered test data for use during normal device operation (e.g., calibration data such as one or more calibration values used by device 10 during normal operation of device 10 by an end user). A device 10 having wireless communications circuitry 18 on which radio-frequency calibration is being performed may sometimes be referred to herein as device under test (DUT) 10'. DUT 10' may, for example, be a fully assembled electronic device that is enclosed within a form factor or device housing or a partially assembled electronic device (e.g., DUT 10' may include some or all of wireless circuitry 18 prior to completion of manufacturing of device 10).

As shown in FIG. 2, DUT 10' may be calibrated in a calibration system 20. Calibration system 20 may include optional external test and calibration computing equipment such as test host 22 and test equipment 24. Test host 22 may include computing equipment such as a personal computer, laptop computer, handheld or portable computer, or any other desired computing equipment and may be coupled to DUT 10' via path 26 (e.g., a wired or wireless communications path). Test host 22 may be coupled to test equipment 24 via path 28 and may convey test/calibration commands to test equipment 24 via path 28. Test equipment 24 may pass test data and other information to test host 22 via path 28.

Test equipment 24 may include equipment for receiving and analyzing radio-frequency signals transmitted by DUT 10' via communications link 30 such as signal analyzer equipment, vector network analyzer (VNA) equipment, radio-frequency tester equipment, etc. For example, DUT 10' may transmit radio-frequency test signals in an uplink direction to test equipment 24 via link 30 and equipment 24 may process the received test signals to characterize and/or calibrate the transmit performance of DUT 10' (e.g., by generating one or more sets of performance metric data and using the performance metric data to generate corresponding radio-frequency calibration data). Test equipment 24 may provide the performance metric data to test host 22. Test host 22 and/or software running on DUT 10' may generate corresponding calibration data based on the test data. Communications link 30 may be a wired communications path (e.g., one or more radio-frequency transmission lines or cables) or a wireless communications path (e.g., maintained using one or more wireless communications protocols). If desired, external test host 22 and test equipment 24 may be omitted from calibration system 20. In this scenario, DUT 10' may transmit radio-frequency test signals and may use the transmitted radio-frequency test signals to characterize and/or calibrate the radio-frequency performance of wireless circuitry 18 without expensive external test and calibration equipment. Such calibration without the use of test equipment such as test equipment 24 and test host 22 may, if desired, be performed during normal device operation (e.g., by an end user after manufacturing and assembly of device 10). As an example, device 10' may be calibrated using test host 22 and test equipment 24 during manufacture of device 10 (e.g., prior to use of device 10 by an end user) and may be re-calibrated after manufacture of device 10 during normal device operation by an end user (e.g., to update calibration data stored on device 10).

As shown in FIG. 2, wireless communications circuitry 18 in device 10' may include one or more antennas such as antennas 60. Antennas 60 may be formed using any suitable antenna types. For example, antennas 60 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Digital data signals that are to be transmitted by device 10 may be provided to baseband processor 34 using path 36 (e.g., from storage and processing circuitry 12 of FIG. 1). Circuit 34 may modulate these signals in accordance with a desired communications protocol (e.g., a desired cellular telephone standard and modulation scheme) and may provide corresponding output signals for transmission to transceiver circuitry 48 via path 38 (e.g., to one or more transmitters 58 in transceiver circuitry 48). Transceiver circuitry 48 may include mixer circuitry that up-converts the output signals to a radio-frequency and that transmits the radio-frequency signals to radio-frequency power amplifier circuitry 46. If desired, digital predistortion (DPD) circuitry 50 may be interposed on path 38. DPD circuitry 50 may provide digital predistortion to the data received from baseband processor 34 for mitigating power amplifier compression associated with amplifier circuitry 46. For example, DPD circuitry 50 may perform gain expansion on the transmit signals using selected digital predistortion coefficients.

Digital predistortion circuitry 50 may, for example, receive IQ samples from baseband processor 34 and optionally convert the IQ samples from the I-Q coordinate plane into an equivalent representation in the polar coordinate plane. Once the IQ samples have been converted into the polar coordinate system in which the magnitude of the signals corresponds to the amplitude of the signal to be transmitted and in which the angle of the signals corresponds to the phase of the signal to be transmitted, circuitry 50 may predistort the converted signals according to a predetermined set of predistortion coefficients. In the example of FIG. 2, the amplitude of the transmitted signals may be altered according to an amplitude modulation predistortion coefficient value (sometimes referred to as the "AMAM" value), whereas the phase of the transmitted signals may be altered according to a phase modulation predistortion coefficient value (sometimes referred to as the "AMPM" value).

Digital-to-analog converter circuitry (not shown) may be interposed on path 38 between DPD circuitry 50 and transceiver circuitry 48 for converting digital data signals to analog data signals for transmission. Circuitry 34 may be implemented using a single integrated circuit (e.g., a baseband processor integrated circuit) or using multiple circuits (e.g., some or all of circuitry 34 may be formed as a part of storage and processing circuitry 12 of FIG. 1). Baseband processor circuitry 34 may include control circuitry for controlling one or more portions of wireless communications circuitry 18.

Control circuitry in baseband processing circuitry 34 may be used to issue control signals on path 40 that adjust the level of voltage Vcc (e.g., sometimes referred to herein as power supply voltage Vcc or power amplifier bias voltage Vcc) that is produced by adjustable power supply circuitry 42 on line 44. Bias voltage Vcc may be used as a power supply voltage for one or more active power amplifier stages in power amplifier circuitry 46.

If desired, signals that are to be transmitted over antennas 60 may be amplified by transmitter circuitry such as transmitters 58 in transceiver circuitry 48 (e.g., using one or more variable gain amplifiers). The output of transceiver circuitry 48 may be coupled to the input of power amplifier circuitry 46 via path 52. Transceiver circuitry 48 may provide signals to be transmitted to the input of power amplifier circuitry 46 (e.g., transmit signals having a corresponding voltage magnitude Vin). Power amplifier circuitry 46 (sometimes referred to as a power amplifier circuit or power amplifier) may contain one or more individual power amplifiers (sometimes referred to herein as amplifier stages or gain stages). During data transmission, power amplifier circuitry 46 may boost the output power of transmitted signals TX to a sufficiently high level to ensure adequate signal transmission. For example, power amplifier circuitry 46 may receive transmit signals from transceiver circuitry 48 having a voltage level Vin and a corresponding input power level Pin and may output amplified transmit signals TX having an output power level Pout (and a corresponding output voltage magnitude Vout). The gain provided by power amplifier circuitry 46 may be defined as the ratio of output power level Pout to input power level Pin.

Radio-frequency (RF) front end circuitry 54 may be coupled to the output of power amplifier circuitry 46. Front end circuitry 54 may include radio-frequency switching circuitry (e.g., multiplexing circuits), passive elements such filtering circuitry (e.g., as duplexers and diplexers), impedance matching circuitry including networks of passive components such as resistors, inductors, and capacitors that ensures that antennas 60 are impedance matched to the rest of circuitry 18, and/or any other desired radio-frequency front end circuitry. If desired, filtering circuitry in front end 54 may be used to route input (receive) and output (transmit) signals based on their frequency. For example, filtering circuitry in front end 54 may transmit (uplink) signals TX from the output of amplifier 46 to antennas 60 and may route receive (downlink) signals RX that have been received by antennas 60 onto receive path 56. If desired, low noise amplifier circuitry (not shown) may be interposed on receive path 56, may amplify received signals RX on path 56, and may provide these signals to transceiver 48 (e.g., to one or more receiver circuits 62 in transceiver circuitry 48). Transceiver circuitry 48 may provide signals received over path 56 to baseband circuitry 34 via path 61 (e.g., after down-converting the signals to a baseband frequency using mixer circuitry).

The output of power amplifier circuitry 46 may be coupled to a feedback path 64 via coupling circuitry such as radio-frequency coupler 66. Feedback path 64 may convey radio-frequency transmit signals TX amplified by power amplifier circuitry 46 to one or more feedback receiver circuits 68 in transceiver circuitry 48. If desired, feedback receiver circuits 68 may process the transmit signals received over feedback path 64 to characterize the radio-frequency performance of transmitters 58 and/or power amplifier circuitry 46. Feedback receiver 68 may generate baseband data corresponding to the signals received over feedback path 64 (e.g., by down-converting the received transmit signals to a baseband frequency using mixer circuitry) and may provide the data to baseband processor circuitry 34 via path 61. Baseband processor circuitry 34 may process the data received from feedback receivers 68 to characterize the radio-frequency performance of wireless circuitry 18 and/or to generate calibration data for wireless circuitry 18 based on the received data. If desired, transmit signals TX may be provided to DPD circuitry 50 via feedback path 64 and DPD circuitry 50 may perform digital predistortion operations on transmit signals received from baseband processor 34 based on the transmit signals TX received over feedback path 64.

Transceiver circuitry 48 may, if desired, be formed on a single integrated circuit or on multiple integrated circuits. For example, transmitter 58, feedback receiver 68, and receiver 62 may be formed on a single shared integrated circuit (chip). In another suitable arrangement, transmitter 58 and feedback receiver 68 are formed on a single shared integrated circuit whereas receivers 62 are formed on one or more separate integrated circuits. In yet another suitable arrangement, feedback receiver 68 and receivers 62 are formed on a single common integrated circuit whereas transmitter 58 is formed on a separate integrated circuit. In another suitable arrangement, transmitters 58 and receivers 62 are formed on a first integrated circuit whereas feedback receiver 68 is formed on a second integrated circuit. In yet another suitable arrangement, transmitter 58, feedback receiver 68, and receivers 62 are each formed on different respective integrated circuits. If desired, additional transmitters may be formed on transceiver circuitry 58 (e.g., on a shared integrated circuit with circuitry 58, 68, and 62).

As device 10 is operated in a cellular network or other wireless communications network, the amount of power that is transmitted by wireless circuitry 18 (e.g., output power level Pout of signals TX) is typically adjusted up and down in real time. For example, if a user is in the vicinity of a cellular tower, the cellular tower may issue a command that instructs device 10 to reduce its transmitted power level (output power level). If a user travels farther away from the tower, the tower may issue a TPC command that requests an increase in transmitted power.

The gain of power amplifier circuitry 46 may be adjusted to conserve power while ensuring that required amounts of output power can be satisfactorily produced. For example, when transmitted power requirements are modest, a lower bias voltage Vcc may be provided to amplifier circuitry 46 by adjustable power supply circuitry 42 to conserve power. However, the magnitude of Vcc can affect power amplifier linearity (e.g., particularly in scenarios where input voltage Vin is relatively high). Nonlinearities can result in signal distortion and adverse effects such as increases in adjacent channel leakage or generation of signal power at harmonic frequencies of the transmit frequency with which transmit signals TX are transmitted by transceiver 48. For example, an amplifier will generally exhibit more adjacent channel leakage (sometimes referred to as adjacent channel leakage ratio or adjacent channel power) at a given output power when operated at a relatively low bias voltage than when operated at relatively high bias voltage. Nevertheless, maximum Vcc levels are generally only required when it is desired to maximize power amplifier linearity. When less power amplifier linearity is tolerable, the magnitude of Vcc can be reduced. Because operation with lowered Vcc settings can reduce power consumption (thereby conserving power for battery 14), device 10 preferably reduces Vcc from its nominal maximum level whenever possible.

When controlling the operation of wireless circuitry 18 in this way to conserve power, care should be taken that relevant operating criteria are being satisfied. For example, a wireless carrier or other entity may require that a cellular telephone meet certain minimum standards when operating in the network of the wireless carrier. A carrier may, for example, establish required limits on adjacent channel leakage. Devices that allow too much adjacent channel leakage will not be permitted to operate in the carrier's network. In addition, non-linearities in power amplifier circuitry 46 may generate harmonic frequency contributions to the transmit signal TX. The harmonic frequency contributions can often overlap with a receive frequency of device 10'. In this scenario, the harmonic contribution of the transmit signal can leak onto receive line 56 of device 10' and can cause errors or distortions in the signals received by receiver 62. Power can be conserved by backing Vcc off from its nominal maximum value, but only so long as this decrease in power amplifier bias does not cause adjacent channel leakage violations, generate undesirable harmonics, or cause other performance criteria to be violated. In general, higher bias voltages Vcc may be required to amplify transmit signals at higher input voltages Vin than transmit signals at lower input voltages Vin in order to ensure suitably low harmonic contributions generated by amplifier 46 for both the higher and lower input voltages.

If desired, adjustable power supply circuitry 42 may (continuously) adjust the bias voltage Vcc that is provided to power amplifier circuitry 46 in real time using a so-called "envelope tracking" process. By performing envelope tracking, adjustable power supply circuitry 42 may continuously adjust the power supply voltage Vcc provided to amplifier 46 up and down based on the voltage level Vin (e.g., based on the voltage level of an modulation envelope of the transmit signal) of the data that is being transmitted by baseband processor 34 (e.g., to help to ensure that amplifier 46 operates at a peak efficiency for the power required to transmit a given signal). For example, adjustable power supply circuitry 42 may include envelope tracking circuitry 68 that generates a bias voltage Vcc corresponding to a particular voltage level Vin that is being transmitted (e.g., so that lower bias voltages Vcc may be used when the transmit signals have a relatively low voltage level Vin and higher bias voltages Vcc may be used when the transmit signals have a relatively high voltage level Vin in order to reduce power consumption while still providing signals with a desired output power level).

Baseband processor circuitry 34 may simultaneously provide transmit data to transceiver circuitry 48 via path 38 and envelope tracking circuitry 68 via path 40. Envelope tracking circuitry 68 process the transmit data received from baseband 34 to determine a corresponding bias voltage Vcc to provide to amplifier 46 for amplifying the radio-frequency signal associated with the transmit data. In some scenarios, baseband processor 70 may generate in-phase and quadrature-phase (I/Q) data associated with the transmit data and may provide the I/Q data to envelope tracking circuitry 68. Envelope tracking circuitry 68 may include magnitude generation circuitry (e.g., circuitry that generates test data magnitude values Vin as the square root of the sum of $I^2$ and $Q^2$) and may include amplifier circuitry that generates bias voltage Vcc based on the generated test data magnitude.

If desired, calibration data 70 may be stored on adjustable power supply circuitry 42. Envelope tracking circuitry 68 may determine a bias voltage Vcc to provide to amplifier 46 based on the transmit data received from baseband processor 34 and based on calibration data 70. For example, calibration data 70 may identify a particular bias voltage Vcc to use for a given voltage Vin of the transmitted data under a variety of operating constraints imposed on wireless circuitry 18 (e.g., so that an appropriate value Vcc may be used for transmit signals having different voltages Vin under any desired operating conditions). The operating constraints may be used in generating calibration data 70 so that supply circuitry 42 selects an appropriate bias voltage Vcc given the desired operating constraints. Operating constraints on wireless circuitry 18 that may be used in generating calibration data 70 may include, for example, power amplifier efficiency constraints associated with amplifier 46, receive band noise constraints, ACLR constraints, etc. (e.g., so that a satisfactory link may be established with an external base station). Tracking circuitry 68 may use the appropriate bias value Vcc identified by the calibration data to bias power amplifier 48 in real time.

Calibration data 70 may be generated by device 10' (e.g., in calibration system 20). For example, calibration software such as calibration software 72 (sometimes be referred to herein as test software) loaded onto DUT 10' may direct DUT 10' to perform power amplifier calibration operations to generate calibration data 70 for use in performing envelope tracking For example, calibration software 72 may direct baseband processing circuitry 34 on DUT 10' to generate test data to be transmitted by transceiver circuitry 48 (e.g., by providing test and calibration commands over path 73) from which performance metric data is gathered for generating corresponding calibration data. In another suitable arrangement, during radio-frequency testing operations, calibration software 72 may provide test data to be transmitted to transceiver circuitry 90 (e.g., via baseband processor 34 or directly to transceiver 48). The transmitted radio-frequency test signals may be conveyed to test equipment 24 via antennas 60 and link 30 and/or may be conveyed to feedback receivers 68 via feedback path 64. Test equipment 24 may process the received radio-frequency test signals to generate radio-frequency performance metric data associated with the wireless performance of DUT 10' based on the test signals. If desired, feedback receiver 68 may process the received radio-frequency test signals to generate radio-frequency performance metric data associated with the wireless performance of DUT 10' based on the transmitted test signals and/or may provide test data corresponding to the received test signals to baseband processor circuitry 34 and/or calibration software 72 for generating corresponding performance metric data.

Calibration software 72 may be implemented on baseband processor 34, on storage and processing circuitry 12, on dedicated calibration processing circuitry, or on any other desired processing circuitry on DUT 10' and may sometimes be referred to herein as calibration module 72, calibration circuitry 72, or calibration engine 72. Calibration software 72 may process the performance metric data gathered by DUT 10' and/or tester 24 to generate calibration data 70. For example, calibration software 72 may identify a set of optimal power supply voltages Vcc to provide to amplifier 46 for a variety of different input voltages Vin and for a variety of different operating constraints. Calibration software 72 may provide calibration data 70 to adjustable power supply circuitry 42 via path 73. Power supply circuitry 42 may use the calibration data 70 for performing envelope tracking operations during normal device operations. Calibration software 72 may be installed onto DUT 10' by test host 22 or by other computing equipment during assembly, manufacture, calibration, and/or testing of DUT 10'.

If desired, adjustable power supply circuitry 42 may generate control signals based on calibration data 70 and may provide the generated control signals to transceiver circuitry 48 via path 45 and may provide the control signals to DPD circuitry 50 via path 47. For example, circuitry 42 may generate radio-frequency gain index (RGI) control signals that control radio-frequency gain index provided by transceiver circuitry 48 to the transmitted signals. Circuitry 42 may generate DPD control signals (e.g., DPD coefficient values) based on calibration data 70 and may provide the DPD control signals to DPD circuitry 50 via path 47 to control the predistortion provided to the transmit signals by DPD circuitry 50. Calibration data 70 may, for example, identify corresponding DPD settings and RGI settings for DPD circuitry 50 and transceiver circuitry 48 for a given transmit signal power level.

Figure 3:
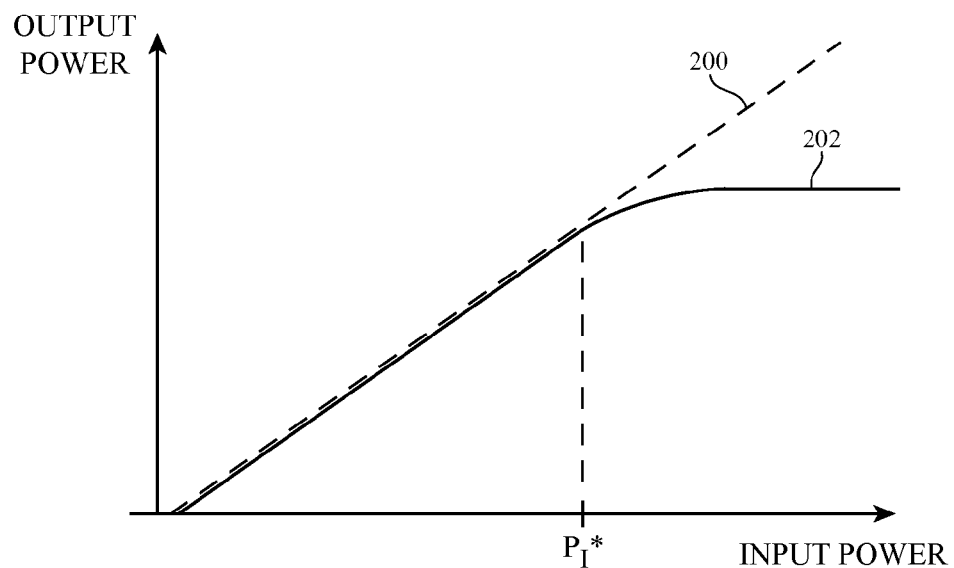
FIG. 3 is an exemplary diagram plotting output power level versus input power level of a radio-frequency power amplifier in accordance with an embodiment.

Ideally, radio-frequency power amplifier 46 exhibits a perfectly linear power response. FIG. 3 plots output power level versus input power level for an illustrative radio-frequency power amplifier. Response line 200 may represent an ideal power characteristic, whereas line 202 may represent an actual power characteristic of the power amplifier in practice. As shown in FIG. 3, line 200 may have a constant slope across all input power levels (i.e., any increase in input power results in a corresponding increase in output power by a predetermined amount).

It is, however, challenging to manufacture power amplifiers that exhibit perfectly linear power transfer characteristics. In practice, increases in input power levels may not always increase the output power by the predetermined amount. As shown by line 202 in FIG. 2, the slope of line 202 may deviate from the desired slope of line 200 after a certain power level PI*. This undesired deviation may result in a reduction in the gain provided by the power amplifier at input power levels greater than PI* and may therefore sometimes be referred to as gain compression. In general, radio-frequency power amplifier 46 in device 10 may exhibit gain compression and/or may deviate from the ideal transfer characteristic in any other way.

Figure 4:
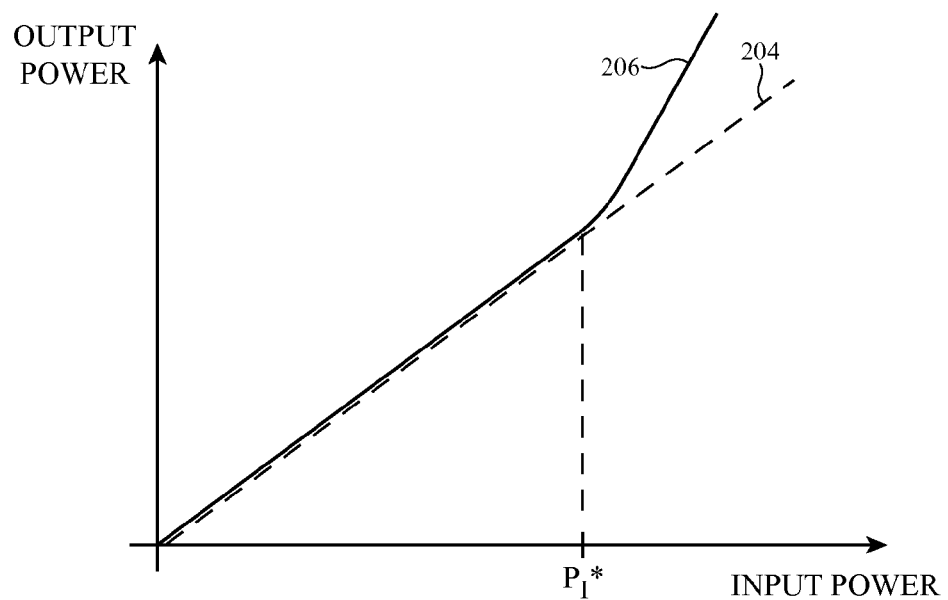
FIG. 4 is an exemplary diagram plotting output power level versus input power level of digital predistortion circuitry in accordance with an embodiment.

As described above in connection with FIG. 2, predistortion circuitry 50 may be used to introduce signal distortion that compensates for undesired deviation(s) from the ideal power transfer characteristic (e.g., to counteract any undesirable non-linear behavior associated with power amplifier 32). FIG. 4 plots output power level versus input power level for an exemplary predistortion circuit. Line 204 may exhibit a constant slope of one, whereas line 206 may exhibit the actual power characteristic of the predistortion circuit. For all signals that are received by the predistortion circuitry and that have power levels less than or equal to PI*, these signals may be passed through to the output of the predistortion circuit without any amplification nor attenuation. For all signals that are received with the predistortion circuit and that have power levels greater than PI*, these signals may be provided with an appropriate amount of gain to compensate for the gain compression associated with the power amplifier as described in connection with FIG. 3. DPD circuitry 50 may generate response 206 using predistortion coefficient values received from adjustable power supply circuitry 42, if desired.

Line 206 of FIG. 4 is merely illustrative. In general, predistortion circuitry 50 may exhibit a power transfer curve having an inverse relationship with respect to the input-output transfer characteristic associated with power amplifier 46 (e.g., a positive deviation in line 202 from line 200 at a given first input power level may be accompanied by a negative deviation in line 206 from line 204 at the given first input power level, whereas a negative deviation in line 202 from line 220 at a given second input power level may be accompanied by a positive deviation in line 206 from line 204 at the given second input power level). Adjustable power supply circuitry 42 may provide control signals to DPD circuitry 50 via path 47 so that DPD circuitry 50 exhibits response 206 for a given transmit signal.

Figure 5:
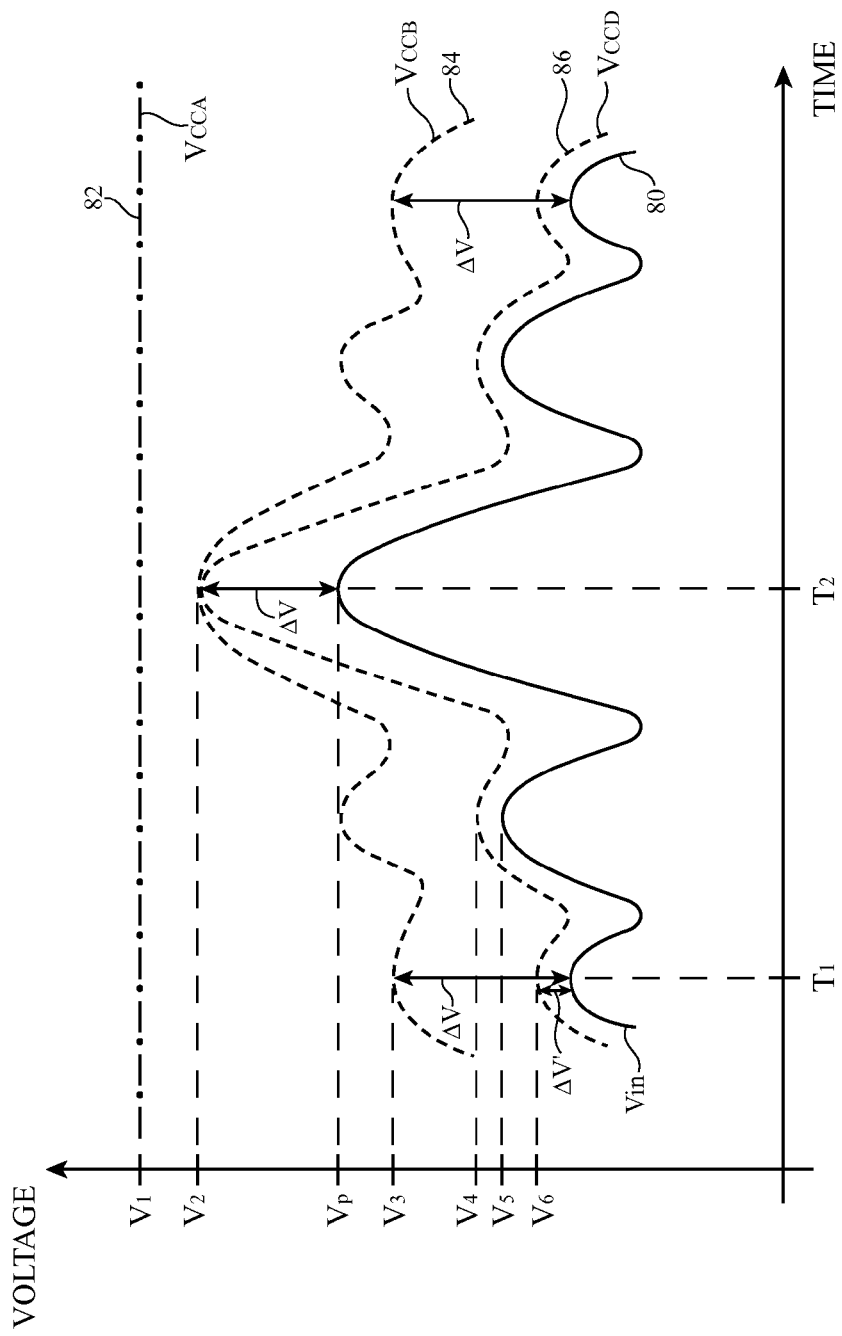
FIG. 5 is an illustrative graph showing how power amplifier bias voltage may be continuously adjusted by different voltage margins relative to a transmit signal for different transmit signal magnitudes based on bias voltage calibration data to reduce power consumption even at relatively low transmit signal magnitudes while satisfying radio-frequency performance requirements in accordance with an embodiment of the present invention.

FIG. 5 is an illustrative plot showing how envelope tracking circuitry 68 in adjustable power supply 42 of DUT 10' may continuously adjust power supply voltage Vcc based on calibration data 70 (e.g., showing how tracking circuitry 68 may perform envelope tracking for amplifier 46). In the graph of FIG. 5, voltages have been plotted as a function of time. Curve 80 illustrates how the voltage Vin of a given signal transmitted by transceiver circuitry 48 and received at the input of amplifier 46 may vary over time. Curve 80 may, for example, represent a modulation "envelope" of the transmitted signal (e.g., an envelope provided by modulating the transmitted signals using baseband processor 34). In order for amplifier 46 to operate properly without generating undesired frequency harmonics of the transmitted signals or other ACLR violations, power supply voltages Vcc provided to amplifier 46 should be greater than the voltage represented by curve 80 during transmission of signals Vin.

Dashed line 82 illustrates a bias voltage VccA that may be provided to amplifier 46 without using envelope tracking (e.g., a constant bias voltage that is not adjusted based on the magnitude of Vin). In this scenario, constant bias voltage VccA is provided that is greater than peak magnitude $V_p$ of transmit signal 80 to ensure that bias voltage Vcc is always greater than the voltage Vin of the transmitted signal so that no undesired frequency harmonics or other ACLR performance violations are generated by amplifier 46. When using a bias voltage VccA as illustrated by line 82, device 10' may consume excessive power, as signal 80 often has a magnitude that is significantly less than peak voltage Vp and that does not require such a high bias voltage to operate without generating radio-frequency performance violations. Adjustable power supply circuitry 42 may perform envelope tracking to reduce overall power consumption by wireless circuitry 18.

Curve 84 illustrates a bias voltage VccB that may be provided in real time by envelope tracking circuitry 68 to amplifier circuitry 46 by adjusting bias voltage Vcc based on the magnitude of input voltage Vcc without using calibration data 70. In this example, bias voltage VccB follows the magnitude Vin of signal 80 such that bias voltage VccB always has a magnitude that is a fixed margin ΔV greater than signal 80 regardless of the magnitude of signal 80 (e.g., bias VccB is greater than the relatively high magnitude Vp of signal 80 at time T2 by margin ΔV, is greater than the relatively low magnitude of signal 80 at time T1 by margin ΔV, etc.). In this way, overall power consumption in device 10 may be reduced relative to scenarios where a constant bias voltage VccA is used.

However, in practice, power amplifier 46 may exhibit insufficient linearity only at excessive input voltage levels Vin. In the example of FIG. 5, amplifier 46 may exhibit insufficient linearity only for transmit voltage magnitudes Vin that are greater than voltage level V4. In this scenario, providing bias signal Vcc at a voltage level V2 that is greater than transmit signal 80 by margin ΔV may be sufficient to provide linearity at time T2 (e.g., when signal 80 has maximum amplitude Vp), but such a high voltage margin ΔV may not be necessary to ensure adequate amplifier linearity at lower input voltage levels Vin such as at time T1 (e.g., a time when signal 80 has a magnitude that is significantly less than peak magnitude Vp). In other words, providing a bias such as VccB at a magnitude that is always greater than signal Vin by a fixed margin ΔV may consume excessive power for relatively low input voltage levels Vin (e.g., at times when a fixed margin ΔV is not necessary to ensure adequate amplifier linearity for amplifier 46). If desired, envelope tracking circuitry 68 may use calibration data 70 to determine suitable bias voltages that exhibit an optimal balance between reducing power consumption in device 10' and allowing for adequate radio-frequency performance of amplifier circuitry 46 in real time.

In the example of FIG. 5, bias voltages VccD associated with curve 86 may be provided by calibration data 70 and may allow device 10 to reduce power consumption by providing bias signals that are greater than the transmit voltage level by different voltage margins over time (e.g., for different input voltages Vin) without sacrificing the spectral performance of amplifier circuitry 46. In other words, bias voltage VccD may be provided to amplifier 46 at voltage levels that are greater than input voltage Vin by non-uniform voltage margins over time. For example, calibrated bias voltage VccD may be greater than magnitude Vp at time T2 by margin ΔV, thereby ensuring adequate spectral performance of amplifier 46 when fed by signals at peak input voltage level Vp. However, calibrated bias voltage VccD may be provided at voltage V6 that is greater than the magnitude of Vin at time T1 by a margin ΔV' that is significantly less than margin ΔV, while still ensuring adequate spectral performance of amplifier 46 (e.g., because linearity of amplifier 46 may be more greatly affected by relatively high input voltages such as voltage Vp than at relatively low input voltages such as the voltage of signal 80 at time T1). Because a fixed margin ΔV may not be needed to ensure adequate linearity and spectral performance for low magnitudes Vin, bias VccD may be reduced relative to bias VccB for relatively low voltages Vin and may thereby further reduce power consumption by device 10' relative to scenarios where bias voltage VccB is used (e.g., without sacrificing the radio-frequency performance of device 10). The example of FIG. 5 is merely illustrative. Calibrated bias voltage VccD may have any desired magnitude as a function of time (e.g., depending on the calibration operations which were used to generate calibration data 70). In general, calibrated bias voltage VccD may be greater than input voltage Vin by different voltage margins at different times (e.g., for different input voltages Vin), thereby allowing for reduced power consumption relative to scenarios where bias voltage Vcc is always greater than input voltage Vin by a fixed voltage margin.

Figure 6:
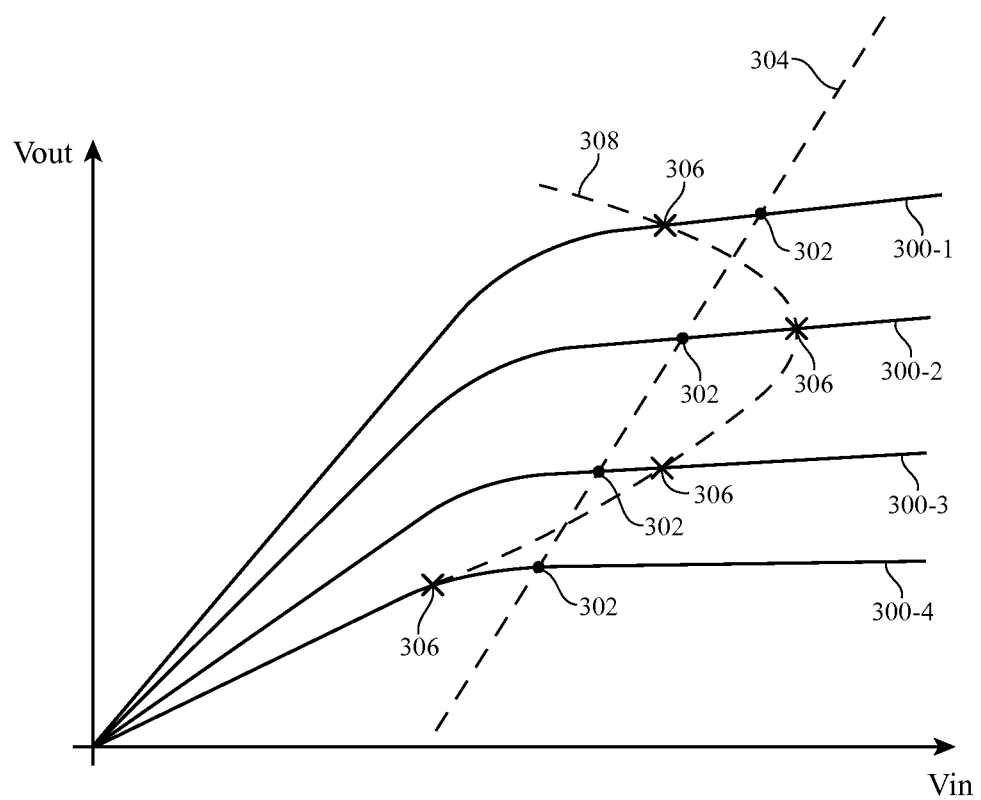
FIG. 6 is an illustrative graph showing how calibration software on an electronic device of the type shown in FIG. 2 may select optimal power amplifier operation points for generating bias voltage calibration data in accordance with an embodiment of the present invention.

Calibration data 70 may identify optimal (calibrated) bias voltages such as bias voltages VccD of FIG. 5 to use based on performance metric data obtained during calibration of device 10 (e.g., calibration data 70 may be generated to allow for suitable amplifier linearity while reducing overall power consumption relative to scenarios where a bias voltage is always greater than input voltage Vin by a fixed voltage margin). FIG. 6 is an illustrative plot showing how calibration software may select optimal amplifier operation points for generating calibration data 70 that identifies optimal bias voltages VccD for use by envelope tracking circuitry 68 during normal device operation to reduce power consumption without sacrificing radio-frequency performance of the device.

FIG. 6 plots the input voltage Vin of amplifier circuitry 46 as a function of the output voltage Vout of amplifier circuitry 46. Curves 300 illustrate the response of amplifier circuitry 46 at different bias voltages Vcc (e.g., a first response 300-1 at a maximum bias voltage such as voltage V2 of FIG. 5, a second response 300-2 at a bias voltage such as voltage V4, a third response 300-3 at a bias voltage such as voltage V5, and a fourth response 300-4 at a bias voltage such as voltage V6). The example of FIG. 6 is merely illustrative and, in general, there may be any desired number of response curves each corresponding to a particular bias voltage provided to amplifier circuitry 46.

As shown in FIG. 6, points 302 may be operation points of amplifier circuitry 46 that are used for determining bias voltages Vcc to provide to amplifier circuitry 46. Points 302 may be fitted by a line 304, such that bias voltages Vcc provided according to operation points 302 are always greater than input Vin by a fixed margin (e.g., points 302 may correspond to bias voltages VccB of FIG. 5 in which bias voltages VccB are provided at a fixed margin ΔV greater than input voltage Vin). Points 306 may be operation points of amplifier circuitry 46 that are used for generating calibration data 70 that identifies calibrated bias voltages Vcc to provide to amplifier circuitry 46. Points 306 may lie on any desired curve such as curve 308 such that bias voltage Vcc is greater than input voltage Vin by any desired voltage margin for each corresponding input voltage Vin (e.g., points 306 may correspond to bias voltages VccD of FIG. 5 in which bias voltages VccD are greater than input voltage Vin by different voltage margins as a function of input voltage Vin). By fitting operation points 306 to any desired curve (e.g., as determined by calibration operations), calibrated bias voltages may be provided that optimally reduce power consumption without sacrificing radio-frequency (e.g., spectral) performance of device 10 at any desired transmit signal voltage Vin.

Figure 7:
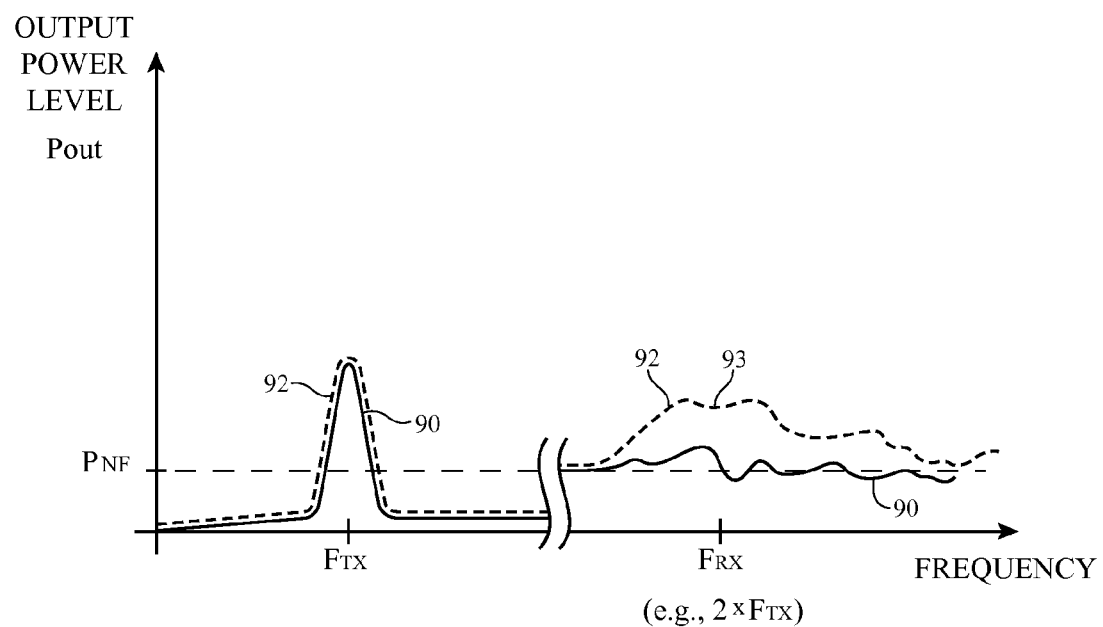
FIG. 7 is an illustrative graph showing how insufficient power amplifier bias voltages supplied to a power amplifier in wireless communications circuitry may cause the power amplifier to generate undesirable radio-frequency power at a receive frequency of the wireless communications circuitry in accordance with an embodiment of the present invention.

FIG. 7 is an illustrative plot showing how insufficient bias voltages Vcc may cause amplifier circuitry 46 to generate undesirable signal contributions at harmonic frequencies of the frequency at which transmit signals TX are transmitted. In the graph of FIG. 7, output power level Pout of amplifier circuitry 46 is plotted as a function of frequency of the transmit signals that are amplified by amplifier circuitry 46. Curve 90 illustrates the output power of amplifier 46 when amplifying transmit signals using a power supply voltage that is sufficiently greater than the voltage of the transmitted signal. For example, curve 90 may illustrate the output power level of amplifier 46 when fed signals associated with curve 80 of FIG. 5 and when powered using a calibrated supply voltage VccD such as that associated with curve 86 of FIG. 5.

Signal 90 may be transmitted using a communications protocol having a transmit frequency band around frequency $F_{TX}$ and a receive frequency band around frequency $F_{RX}$. Transmitted signal 90 may have a signal peak at transmit frequency $F_{TX}$. Signal 90 may exhibit a noise floor having a power level $P_{NF}$ at receive frequency $F_{RX}$. Noise floor power level $P_{NF}$ may specify a receive band noise floor value for the transmitted signal. The receive band noise floor value may, if desired, be used to characterize the performance of wireless circuitry 18 during calibration operations.

Curve 92 illustrates the output power level of amplifier 46 when powered using an insufficient supply voltage Vcc (e.g., when bias voltage Vcc is provided at a level less than V2 at time T2 or at a level less than V6 at time T1 in the example of FIG. 5). Signal 92 may have a signal peak at transmit frequency $F_{TX}$. However, as the bias signal associated with signal 92 is insufficient to ensure adequate performance of amplifier 46, signal 92 may exhibit a harmonic peak 93 that coincides with receive frequency $F_{RX}$ (e.g., a frequency $F_{RX}$ that is equal to $2*F_{TX}$). The harmonic peak of signal 92 may undesirably leak onto the receive path of transceiver circuitry 48 causing interference with radio-frequency receive signals that are received by antenna 60. By performing envelope tracking operations using calibration data 70 to ensure that an optimal bias voltage Vcc is used for transmit signal 80, circuitry 18 may reduce power consumption without undesirably impacting radio-frequency performance (e.g., without generating undesirable harmonic power contributions such as peak 93).

Figure 8:
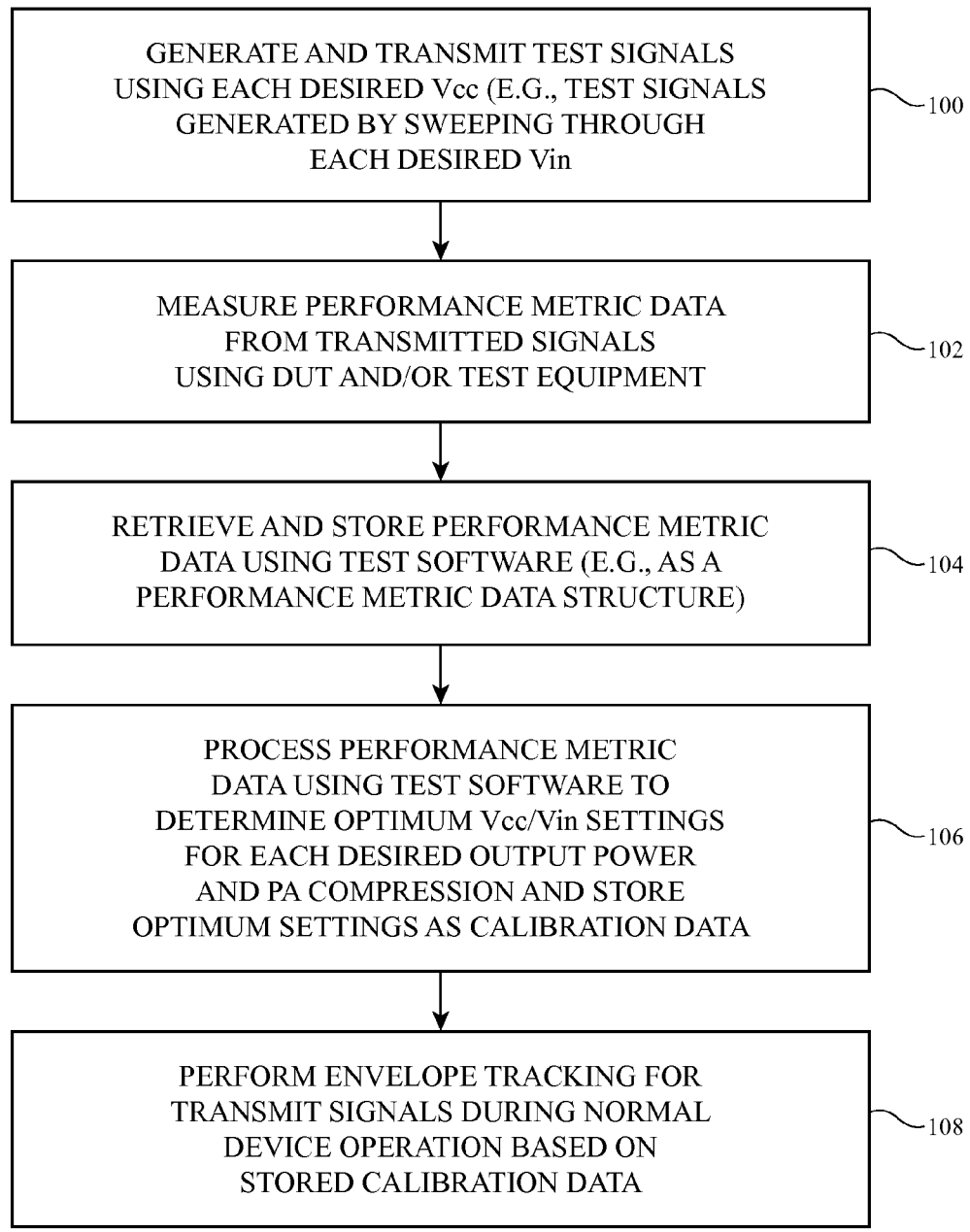
FIG. 8 is a flow chart of illustrative steps that may be performed by wireless communications circuitry for generating power amplifier bias voltage calibration data using radio-frequency test signals generated and measured by the wireless communications circuitry and for using the calibration data to perform wireless transmission in accordance with an embodiment of the present invention.

FIG. 8 is a flow chart of illustrative steps that may be performed by device 10' to generate calibration data 70 and to use calibration data 70 to perform optimized envelope tracking operations that reduce power consumption in device 10 without undesirably impacting the performance of wireless circuitry 18. The steps of FIG. 8 may, for example, be performed by DUT 10' while coupled to external test equipment 24 and test host 22 or may be performed without the use of external test equipment. In one suitable arrangement, steps 100-106 of FIG. 8 may be performed while coupled to external test equipment, whereas step 108 is performed without external test equipment (e.g., during normal operation of device 10 by an end user).

At step 100, DUT 10' may generate and transmit radio-frequency test signals using a set of different desired power supply voltages Vcc. Calibration software 72 may instruct baseband processor 34 to generate the radio-frequency test signals using multiple different signal power levels (e.g., transmit signal voltages Vin) and may instruct adjustable power supply circuitry 42 to generate different desired bias voltage levels Vcc for transmitting the test signals. For example, baseband processor 34 may generate test signals by instructing baseband processor 34 and/or transceiver 48 to generate test signals by sweeping through a series of different voltage levels Vin while power supply circuitry 42 uses multiple different bias voltages Vcc (e.g., each bias voltage or a subset of the bias voltages Vcc producible by supply circuitry 42). The amplified test signals may be transmitted by antenna 60 and/or fed back to feedback receiver 68 via feedback path 64.

Figure 9:
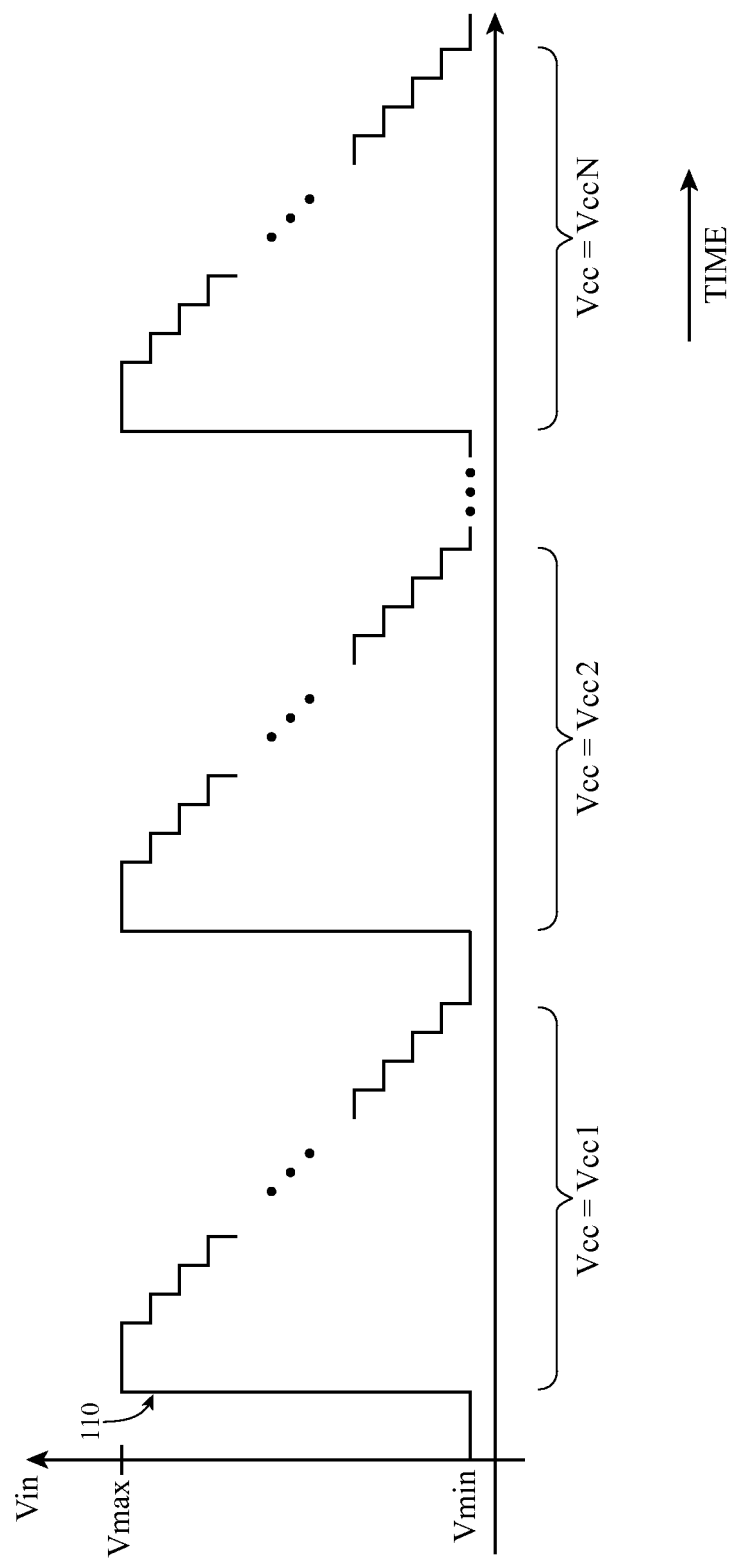
FIG. 9 is a graph of an illustrative sequence of radio-frequency test signals that may be produced by wireless communications circuitry at multiple transmit voltage levels with multiple amplifier bias voltage levels for generating bias voltage calibration data in accordance with an embodiment of the present invention.

FIG. 9 is a plot showing illustrative test signals that may be generated by wireless circuitry 18. As shown in FIG. 9, curve 110 illustrates the voltage level of test signals generated by wireless circuitry 18 (e.g., while processing step 100 of FIG. 8). Test signals 110 may be generated by cycling through N different bias voltages Vcc (e.g., a first bias voltage Vcc1, a second bias voltage Vcc2, an Nth bias voltage VccN, etc.). While each power supply voltage Vcc is provided to power amplifier circuitry 46, transceiver circuitry 48 may sweep through a sequence of different voltage levels Vin for test signal 110 so that multiple different voltage levels are provided for each power supply voltage Vcc. Transceiver circuitry 48 may sweep through any desired number of voltage levels Vin (e.g., all possible voltage levels or a subset of the possible voltage levels) between a maximum voltage Vmax and a minimum voltage Vmin. The test signals may be used by DUT 10' and/or tester 24 to measure performance metric data from the test signals for each of the different transmit signal voltage levels Vin and bias voltages Vcc (e.g., to characterize the wireless performance of DUT 10' over a wide range of operating conditions).

Returning to FIG. 8, at step 102, DUT 10' and/or tester 24 may measure performance metric data from transmitted test signals 110. For example, tester 24 may measure output power levels of the test signals transmitted by DUT 10', ACLR values, or any other desired performance metric values. If desired, feedback receiver 68 may convert the received test signals to corresponding baseband frequency data and may convey the data to baseband processor 34 and/or calibration software 72. Baseband processor 34 and/or calibration software 72 may process the data received from feedback receiver 68 to generate corresponding performance metric data. For example, baseband processor 34 and/or software 72 may measure output power level of the signals received by feedback receiver 68, ACLR values associated with the received signals, receive band noise associated with the transmit signals, or any other desired performance metric data.

If desired, feedback receiver 68 may measure one or more performance metrics from the transmitted test signals received on path 64. For example, feedback receiver 68 may include Fourier transform circuitry (e.g., fast Fourier transform circuitry) that computes Fourier transforms of the received signals. Feedback receiver 68 may compute performance metric data such as receive band noise floor values using the Fourier transforms of the received signals and may provide the receive noise floor values to baseband circuitry 34 and/or calibration software 72. If desired, feedback receiver 68 may characterize amplifier compression of power amplifier 46 (e.g., may compute one or more amplifier compression values) and may generate power amplifier efficiency values associated with the efficiency of power amplifier 46. Feedback receiver 68 may provide the efficiency values and compression values to baseband 34 and/or calibration software 72. In another suitable arrangement, baseband processor 34 may include power amplifier compression measurement circuitry such as measurement circuitry 33 as shown in FIG. 2. Compression measurement circuitry 33 may receive test signals from feedback receiver 68 and may process the test signals to determine the compression of amplifier 46. If desired, DPD circuitry 50 may generate DPD coefficient values based on the signals received over feedback path 64 and may provide the coefficient values to calibration software 72, baseband processor 34, and/or adjustable power supply circuitry 42.

At step 104, calibration software 72 may retrieve and store the measured performance metric data. For example, calibration software 72 may retrieve performance metric data from baseband processor 34 and/or feedback receiver 68 (e.g., over paths 73). In scenarios where external test equipment 24 measures performance metric data using the test signals generated by DUT 10', calibration circuitry 72 may retrieve the measured performance metric data from test host 22 via path 26. Calibration circuitry 72 may store the retrieved performance metric data (e.g., on storage and processing circuitry 12) for further processing.

At step 106, calibration software 72 may process the retrieved performance metric data to generate calibration data 70. Calibration software 72 may, for example, determine the optimum (calibrated) power supply voltage Vcc to use during envelope tracking for every possible transmit signal voltage level Vin that can be used to transmit signals. If desired, calibration software 72 may determine optimum supply voltages Vcc for every possible transmit signal voltage level (desired output power level) in order to ensure that an appropriate supply voltage Vcc is available for power supply circuitry 42 for a wide range of different device operating conditions. Calibration software 72 may store the calibration data 70 (e.g., on storage circuitry 12, on power supply circuitry 42, or on any other desired storage circuitry) for use during normal device operation. For example, calibration software 72 may generate a list (e.g., table or data structure) of calibrated (optimal) power supply voltages Vcc to use for every possible transmit signal voltage level Vin (or for any desired subset of every possible transmit signal voltage level Vin).

If desired, calibration software 72 may be removed (uninstalled) from DUT 10' after generating calibration data 70. In another suitable arrangement, calibration software 72 may be stored on device 10' for use during normal operation of device 10'. For example, calibration software 72 may be called during normal device operation to generate updated (new) calibration data (e.g., to account for any variations or changes in the performance of wireless circuitry 18).

At step 108, device 10 (e.g., DUT 10' after calibration operations have been completed) may perform envelope tracking operations for transmitting signals during normal device operations using stored calibration data 70. For example, when transmitting radio-frequency signals, adjustable power supply circuitry 42 may look up a suitable power supply voltage Vcc to provide to power amplifier circuitry 46 from calibration data 70 based on the signals that are to be amplified using amplifier 46. Adjustable power supply circuitry 42 may, if desired, provide DPD control signals (e.g., DPD coefficient values) to DPD circuitry 50 and RGI control signals to transceiver circuitry 48 based on calibration data 70. As an example, adjustable power supply circuitry 42 may provide calibrated bias voltages such as bias voltages VccD to amplifier circuitry 46 when amplifier circuitry 46 receives transmit signals 80 at input voltages Vin as shown in FIG. 5.

Figure 10:
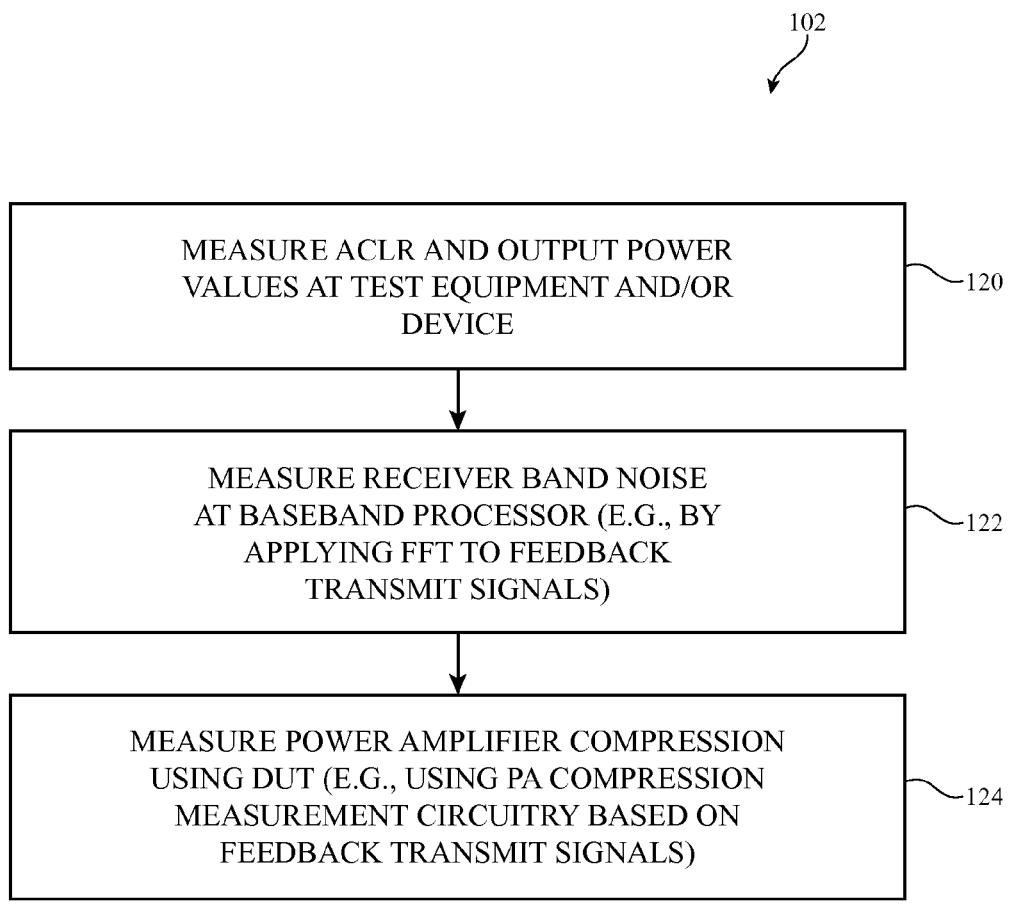
FIG. 10 is a flow chart of illustrative steps that may be performed by wireless communications circuitry and/or external test equipment for generating radio-frequency performance metric data in response to radio-frequency test signals of the type shown in FIG. 9 that can be used for generating bias voltage calibration data in accordance with an embodiment of the present invention.

FIG. 10 is a flow chart of illustrative steps that may be performed by DUT 10' to measure performance metric data from the transmitted test signals (e.g., test signals such as test signals 110 of FIG. 7) for generating calibration data 70. The steps of FIG. 10 may, for example, be performed by DUT 10' while processing step 102 of FIG. 8.

At step 120, DUT 10' and/or test equipment 24 may measure ACLR values and output power level values from transmitted test signals 110. For example, DUT 10' and/or test equipment 24 may measure a corresponding ACLR value and output power level value for each magnitude Vin of transmitted test signals 110 and for each bias voltage Vcc that is used to produce test signals 110 (e.g., so that an ACLR value and output power level value is generated for each desired or producible combination of Vin and Vcc). Baseband processor circuitry 34 may receive test data from feedback receiver 68 (e.g., generated in response to transmit signals received on feedback path 64) and may generate the ACLR value and output power level value in response to the received test data. Baseband 34 may provide the measured ACLR and output power level values to test software 72. If desired, test equipment 24 may measure output power level values and ACLR power level values from test signals 110 for each desired combination of Vin and Vcc and may provide the measured values to calibration software 72. Calibration software 72 may store the received ACLR and output power level values in a performance metric data structure for use during subsequent processing and generation of calibration data 70.

At step 122, feedback receiver 68 may measure receive band noise (e.g., receive band noise floor values) from the transmitted test signals received over feedback path 64. The receive band noise values may characterize the amount of transmitted signal that leaks into a receive frequency band of wireless circuitry 18. For example, feedback receiver 68 may perform fast Fourier transform operations to generate a Fourier transform of the transmitted test signals and may generate receive band noise values using the Fourier transform of the transmitted test signals. Feedback receiver 68 may generate a receive band noise value for each transmit signal magnitude value Vin of test signals 110 and for each power amplifier bias value Vcc used to amplify test signals 110. Feedback receiver circuitry 68 may provide the receive band noise values to baseband processor 34 and calibration software 72. Calibration software 72 may store the receive band noise values corresponding to each Vin and Vcc of test signals 110 in the performance metric data structure for subsequent processing.

At step 124, feedback receiver circuitry 68 may measure power amplifier compression (e.g., one or more compression values) associated with power amplifier circuitry 46 based on transmitted test signals 110 received over path 64 (e.g., a corresponding compression value for each combination of Vin and Vcc used for transmitting test signals 110). Feedback receiver circuitry 68 may pass the compression values to baseband processor circuitry 34 and calibration software 72. In another suitable arrangement, power amplifier compression measurement circuitry 33 on baseband processor 34 may receive test data corresponding to test signals 110 and may measure compression values associated with amplifier circuitry 46 from the test data. Calibration software 72 may store the compression values corresponding to each Vin and Vcc of test signals 110 in the performance metric data structure. If desired, DPD circuitry 50, baseband processor 34, and/or transceiver 48 may generate DPD coefficient values (e.g., based on an inverse of the computed power amplifier compression values) such as the DPD coefficient values associated with curve 206 of FIG. 4 and may provide the DPD coefficient values to calibration software 72. The example of FIG. 10 is merely illustrative and, if desired, steps 120-124 may be performed in any desired order (e.g., steps 120-124 may be performed concurrently, simultaneously, etc.). DUT 10' and/or tester 24 may be used to gather any desired performance metric data associated with any desired radio-frequency performance metric.

Ideally, radio-frequency power amplifier 46 exhibits a perfectly linear power response. It is, however, challenging to manufacture power amplifiers that exhibit perfectly linear power transfer characteristics. In practice, increases in input power levels may not always increase the output power by the predetermined amount. This undesired deviation may result in a reduction in the gain provided by the power amplifier may therefore sometimes be referred to as gain compression. Gain compression of amplifier 46 may be characterized by corresponding gain compression values measured by receiver circuitry 68 and/or measurement circuitry 33. Receiver circuitry 68 and/or measurement circuitry 33 may measure gain compression values, for example, as the input (or output) power level of amplifier 46 when the gain response of amplifier 46 differs from an idea gain response by a predetermined amount (e.g., 1 dB, 2 dB, etc.).

Figure 11:
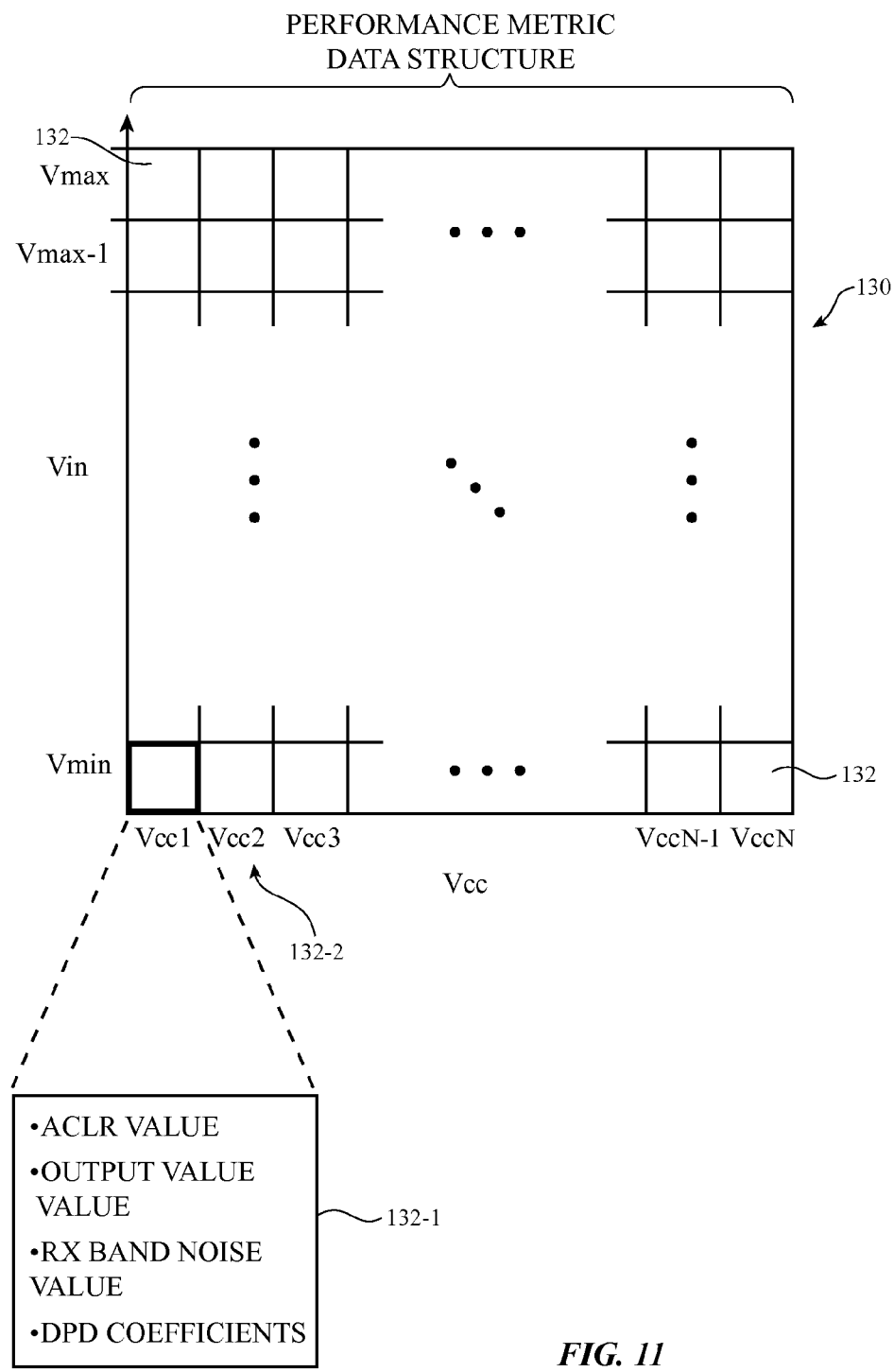
FIG. 11 shows an illustrative radio-frequency performance metric data structure that may be generated by wireless communications circuitry using gathered radio-frequency performance metric data over a range of different test signal transmit magnitudes and bias voltages that may be processed to generate bias voltage calibration data in accordance with an embodiment of the present invention.

FIG. 11 is an illustrative diagram of a performance metric data structure (e.g., a table, array, or other data structure) that may be generated by calibration engine 72 using performance metric data measured by DUT 10' and/or tester 24. As shown in FIG. 11, performance metric data structure 130 may include multiple cells (entries) 132 in a Vin-Vcc space (e.g., data structure 130 may be arranged in an array of rows corresponding to input voltages from Vmax to Vmin and corresponding columns corresponding to bias voltages from Vcc1 to VccN). DUT 10' and/or tester 24 may measure ACLR values, output power level values, receive band noise values, power amplifier compression values, and DPD coefficients for each transmit signal magnitude Vin and bias voltage Vcc used for transmitting test signals 110 (e.g., while processing the steps of FIG. 10). Calibration software 72 may populate data structure 130 using the measured data. For example, calibration software 72 may store a first ACLR value, output power level value, receive band noise value, PA compression value, and set of DPD coefficients measured from test signals 110 while test signals 110 have magnitude Vmin and while amplifier 46 receives bias voltage Vcc1 in a first cell 132-1 corresponding to magnitude Vmin and bias voltage Vcc1, may store a second ACLR value, output power level value, receive band noise value, PA compression value, and set of DPD coefficients measured from test signals 110 while test signals 110 have magnitude Vmin and while amplifier 46 receives bias voltage Vcc2 in a second cell 132-2 corresponding to magnitude Vmin and bias voltage Vcc2, etc. By sweeping through magnitudes Vin and bias voltages Vcc when generating test signals 110, DUT 10' may fully characterize wireless performance for all possible Vin and Vcc values that may be used for generating radio-frequency transmit signals and may store performance metric data in corresponding cells 132 of data structure 130. Performance metric data structure 130 may be subsequently processed for generating calibration data 70 (e.g., for determining optimal bias voltages Vcc to use for each transmit signal magnitude Vin and corresponding device operating constraints).

Figure 12:
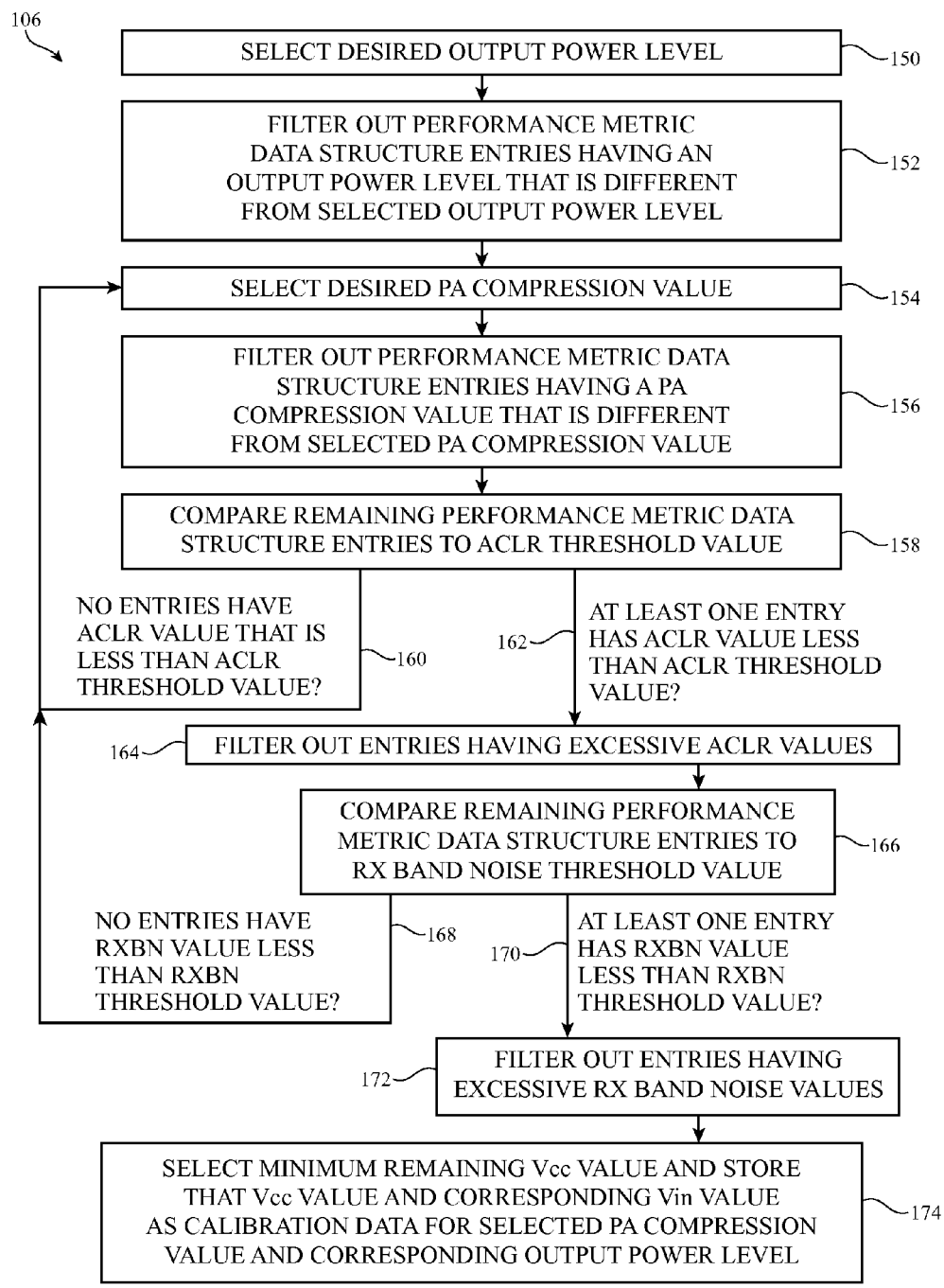
FIG. 12 is a flow chart of illustrative steps that may be performed by wireless communications circuitry for processing gathered radio-frequency performance metric data (e.g., a performance metric data structure such as that shown by FIG. 11) for generating bias voltage calibration data that reduces overall power consumption in the wireless communications circuitry while satisfying radio-frequency performance requirements in accordance with an embodiment of the present invention.

FIG. 12 is a flow chart of illustrative steps that may be performed by calibration engine 72 for generating envelope tracking calibration data 70 using performance metric data gathered by DUT 10' and/or tester 24. For example, calibration software 72 may process performance metric data structure 130 of FIG. 11 for generating calibration data 70. The steps of FIG. 12 may, for example, be performed by calibration software 72 while processing step 106 of FIG. 8.

At step 150, calibration software 72 may select a desired test signal output power level from performance metric data structure 130 (e.g., a desired measured output power level as measured at DUT 10' or tester 24 while processing step 120 of FIG. 8). For example, calibration software 72 may select a desired output power level of 30 dB.

At step 152, calibration software 72 may filter out entries in performance metric data structure 130 having output power levels that are different from the selected output power level (e.g., software 72 may generate filtered performance metric data or a filtered data structure from which entries with measured output power levels that are different from the selected output power level are removed). For example, if software 72 selects a desired output power level of 30 dB, software 72 may filter out cells 132 having measured output power levels that are different than 30 dB. In this way, only entries in performance metric data structure 130 having the selected power level may be used for further processing and generation of one or more entries of calibration data 70.

At step 154, calibration software 72 may select a desired amplifier compression value (e.g., a desired compression value as measured by feedback receiver 68 and/or baseband measurement circuitry 33). At step 156, software 72 may filter out entries from performance metric data 130 having power amplifier compression values that are different from the selected compression value (e.g., software 72 may generate filtered performance metric data or a filtered data structure from which entries with measured compression values that are different from the selected compression values are removed). For example, if software 72 selects a desired compression value of 2 dB, software 72 may filter out cells 132 having compression values that are different than 2 dB. In this way, only entries in performance metric data structure 130 having the selected power level and compression level may be used for further processing and for generation of one or more entries of calibration data 70.

At step 158, calibration software 72 may compare the performance metric entries (e.g., the cells 132 in filtered data structure 130 remaining after filtering out cells with undesired output power levels and/or undesired compression values) to a selected (e.g., predetermined) adjacent channel leakage ratio threshold. For example, software 72 may identify the corresponding measured ACLR value in each remaining filtered entry of data structure 130 and may compare the identified ACLR values to a desired ACLR threshold value. The ACLR threshold value may be determined by carrier requirements, design requirements, engineering requirements, or any other desired requirements or standards for the radio-frequency performance of device 10. For example, the desired threshold may be set by a user of device 10 or a designer of device 10 so that device 10 has satisfactory radio-frequency performance after calibration (e.g., a user may specify the desired threshold value prior to processing step 150 or at any other desired time while processing the steps of FIG. 10). By comparing the remaining entries to the ACLR threshold value, software 72 may determine which entries correspond with satisfactory ACLR performance. For example, entries having a measured ACLR value that is less than the ACLR threshold value may indicate satisfactory ACLR performance whereas entries having a measured ACLR value that is greater than or equal to the threshold may indicate insufficient ACLR performance when DUT 10' generated the corresponding test signals.

If no entries in filtered data structure 130 remain that have a corresponding measured ACLR value that is less than the ACLR threshold value, processing may loop back to step 154 as shown by path 160 to select a different desired amplifier compression value (e.g., to adjust the filtering of data 130 to include a different set of cells 132 upon filtering by amplifier compression value).

If at least one entry in filtered performance metric data structure 130 includes a corresponding measured ACLR value that is less than the ACLR threshold value, processing may proceed to step 164 as shown by path 164. At step 164, calibration software 72 may filter out the remaining entries from filtered performance metric data 130 having ACLR values that are greater than or equal to the ACLR threshold value (e.g., software 72 may generate filtered performance metric data entries from which entries having excessive measured ACLR values have been removed). In this way, only entries in performance metric data structure 130 having satisfactory measured ACLR values may be used for generating a corresponding calibration data entry.

At step 166, calibration software 72 may compare the remaining performance metric data entries (e.g., the cells 132 in filtered data structure 130 remaining after filtering out cells with excessive ACLR values) to a selected (e.g., predetermined) receive band noise threshold. For example, software 72 may identify the corresponding receive band noise value in each remaining filtered entry 132 of data structure 130 and may compare the identified receive band noise values to a desired receive band noise threshold value. The receive band noise threshold value may be determined by carrier requirements, design requirements, engineering requirements, or any other desired requirements or standards for the radio-frequency performance of device 10. For example, the desired threshold may be set by a user of device 10 or a designer of device 10 so that device 10 has satisfactory radio-frequency performance after calibration (e.g., a user may specify the desired threshold value prior to processing step 150 or at any other desired time while processing the steps of FIG. 10). By comparing the remaining entries to the receive band noise threshold value, software 72 may determine which entries correspond with satisfactory receive band noise performance of wireless circuitry 18 (e.g., values for which amplifier 46 does not generate power at harmonic frequencies of the transmit frequency that overlap with a receive frequency of transceiver 48). For example, entries having a measured receive band noise value that is less than the receive band noise threshold value may indicate satisfactory receive band noise performance whereas entries having a measured receive band noise value that is greater than or equal to the threshold may indicate insufficient receive band noise performance when DUT 10' generated the corresponding test signals.

If no entries in filtered data structure 130 remain that have a corresponding measured receive band noise value that is less than the receive band noise threshold value, processing may loop back to step 154 as shown by path 168 to select a different desired amplifier compression value (e.g., to adjust the filtering of data 130 to include a different set of cells 130 upon filtering by compression value). If at least one entry in filtered performance metric data structure 130 includes a corresponding measured receive band noise value that is less than the receive band noise threshold value, processing may proceed to step 172 as shown by path 170.

At step 172, calibration software 72 may filter out entries from the filtered performance metric data 130 having receive band noise values that are greater than or equal to the receive band noise threshold value (e.g., software 72 may generate filtered performance metric data entries from which entries having excessive measured receive band noise values have been removed). In this way, only entries in performance metric data structure 130 having satisfactory measured receive band noise values may be used for further processing and for generation of corresponding entries of calibration data 70.

At step 174, calibration software 72 may use the remaining entry of filtered performance metric data structure 130 for generating calibration data 70. For example, software 72 may store the remaining entry 132 as an entry in calibration data 70 (e.g., as shown in FIG. 7) so that the corresponding bias voltage Vcc of that remaining entry is used for the associated transmit signal magnitude Vin when performing signal transmission during normal device operation. In the example of FIG. 11, if entry 132-1 is the sole entry of performance metric data structure 130 remaining, the ACLR value, output power value, receive band noise value, power amplifier compression value, and DPD coefficients of entry 132-1 may be stored as an entry in calibration data 70. If more than one entry 132 remains in filtered data structure 130, software 72 may select the filtered entry having the least bias voltage Vcc. For example, if two entries in filtered data structure 130 remain after filtering by receive band noise, software 72 may select the entry having the smallest (least) bias voltage value Vcc for use as calibration data 70. In this way, software 72 may minimize power consumption in device 10 while ensuring that each desired performance metric requirement is satisfied (e.g., while ensuring satisfactory wireless performance of device 10). The threshold values of FIG. 12 (e.g., the ACLR threshold value, the RX band noise values, etc.) may define a set of operating constraints on device 10. The operating constraints may be specified by a user, designer, tester, calibrator, or manufacturer of device 10 so that device 10 has desired radio-frequency characteristics (e.g., characteristics that allow for satisfactory radio-frequency performance).

The entry of data structure 130 stored as calibration data 70 may correspond to a particular output power level, transmit voltage magnitude Vin, and power amplifier compression value (e.g., set of DPD coefficient values). The steps of FIG. 12 may be repeated for each desired output power level (e.g., each transmit voltage magnitude Vin) until calibration data 70 is populated with a complete set of bias voltages Vcc for any desired combination of operating constraints and transmit signal magnitudes (e.g., so that an optimal bias voltage value Vcc may be used for any desired transmit signals and operating conditions while performing envelope tracking operations on the transmit signals). If desired, calibration may be performed only on a subset of operating conditions and transmit signal magnitudes (e.g., to reduce the time required for generating calibration data 70, etc.).

In this way, a designer or user of DUT 10' may specify desired requirements for wireless performance of circuitry 18 and engine 72 may autonomously select an optimal (e.g., minimum) bias voltage for those requirements and for each possible transmit signal magnitude Vin (e.g., so that an optimal bias voltage Vcc is used for any desired transmit signal that minimizes power consumption while ensuring satisfactory wireless performance).

The example of FIG. 12 is merely illustrative. If desired, steps 150-172 may be performed in any desired order. Any desired performance metrics may be measured and stored in performance metric data structure 130 and any desired performance metric thresholds or requirements may be applied to filter data structure 130 for generating calibration data 70.

FIG. 13 is a diagram showing exemplary calibration data such as calibration data 70 that may be generated by calibration engine 72 and stored on device 10 for use in performing envelope tracking operations on transmitted signals. As shown in FIG. 13, calibration data 70 may be arranged in a table or data structure having multiple entries (rows) that each corresponding to a calibrated bias voltage Vcc to provide to amplifier circuitry 46. Table 70 may, for example, be generated by calibration software 72 while processing step 106 of FIG. 8.

Envelope tracking circuitry 68 in adjustable power supply 42 may process table 70 to determine an optimal bias voltage Vcc to provide to amplifier circuitry 46 in real time as radio-frequency signals are transmitted by transceiver circuitry 48 (e.g., while processing step 108 of FIG. 8). For example, tracking circuitry 68 may receive a transmit signal from baseband processor 34 and may identify a corresponding output power level Pout associated with the transmit signal. Tracking circuitry 68 may identify entries in calibration data 70 corresponding to the identified output power level Pout may provide the corresponding calibrated bias voltage Vcc (e.g., as specified in table 70) to amplifier circuitry 46. If desired, tracking circuitry 68 may provide corresponding RGI control signals and DPD coefficients to transceiver circuitry 48 and DPD circuitry 50, respectively, based on the identified entry in calibration data 70.

In the example of FIG. 13, at a given point in time, tracking circuitry 68 may determine that signals are to be transmitted at desired output power level $P_1$. Power level $P_1$ may, for example, correspond to peak input voltage level Vp of the transmit signal 80 as shown in FIG. 5. Tracking circuitry 68 may determine that the first entry (row) of calibration data 70 corresponds to power level $P_1$ and may select the corresponding RGI value $RGI_1$, bias voltage (e.g., 3.8 V), and DPD coefficients $DPD_A$ from that entry in table 70 to provide to transceiver circuitry 48, power amplifier circuitry 46, and DPD circuitry 50, respectively. At a subsequent point in time, tracking circuitry 68 may determine that the signals are to be transmitted at desired output power level $P_2$. Power level $P_2$ may, for example, correspond to input voltage level V5 of transmit signal 80 as shown in FIG. 5. Tracking circuitry 68 may determine that the second entry in calibration data 70 corresponds to power level $P_2$ and may select the corresponding RGI value $RGI_2$, bias voltage (e.g., 2.0 V), and DPD coefficients $DPD_B$ from that entry in table 70 to provide to transceiver circuitry 48, power amplifier circuitry 46, and DPD circuitry 50 respectively. By operating on that transmit signal using the settings identified by calibration data 70, device 10 may ensure that a minimum amount of bias voltage is provided to amplifier 46 to ensure satisfactory radio-frequency performance (e.g., thereby reducing overall power consumption in the device).

The example of FIG. 13 is merely illustrative. If desired, calibration data 70 may include any desired device operating constraints and settings for the transmission of signals using device 10. Any desired calibrated bias voltages may be identified by calibration data 70 (e.g., as determined by the calibration steps of FIG. 12). If a transmit signal that is to be transmitted has a signal power level at a given point in time that is between two signal power levels identified by calibration data 70 (e.g., a power level less than power level $P_1$ and greater than power level $P_2$), envelope tracking circuitry 68 may select the greater power level (e.g., power level $P_1$ in a scenario where the power level to transmit is less than power level $P_1$ and greater than power level $P_2$) for identifying an entry in calibration data 70 (e.g., to ensure that satisfactory radio-frequency performance is maintained at the expense of using slightly more power in device 10).

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
   radio-frequency transmitter circuitry configured to transmit radio-frequency signals;
   power amplifier circuitry configured to amplify the transmitted radio-frequency signals;
   radio-frequency receiver circuitry coupled to an output of the power amplifier circuitry via a feedback path, wherein the radio-frequency receiver circuitry is configured to generate performance metric data based on the amplified radio-frequency signals;
   processing circuitry configured to generate calibration data for the power amplifier circuitry based on the performance metric data generated by the radio-frequency receiver circuitry; and
   circuitry that controls a gain provided by the power amplifier circuitry in amplifying the transmitted radio-frequency signals based on the calibration data, wherein the circuitry comprises storage circuitry that stores the calibration data, the calibration data comprises a data structure having a plurality of entries, and each entry of the plurality of entries has a corresponding output power level for the power amplifier circuitry and a corresponding bias voltage for the power amplifier circuitry.

2. The electronic device defined in claim 1, wherein the radio-frequency receiver circuitry is configured to generate a compression value associated with the power amplifier circuitry and wherein the processing circuitry is configured to generate the calibration data based on the compression value.

3. The electronic device defined in claim 1, wherein the radio-frequency transmitter circuitry and the radio-frequency receiver circuitry are formed on a common integrated circuit.

4. The electronic device defined in claim 1, further comprising:
   baseband processing circuitry that is coupled to the processing circuitry and that generates baseband data.

5. The electronic device defined in claim 4, further comprising:
   digital predistortion circuitry coupled between an output of the baseband processing circuitry and an input of the radio-frequency transmitter circuitry, wherein the digital predistortion circuitry performs digital predistortion operations on the baseband data based on a set of digital predistortion coefficients.

6. The electronic device defined in claim 5, further comprising:
   circuitry configured to generate the digital predistortion coefficients based on the calibration data and to provide the digital predistortion coefficients to the digital predistortion circuitry.

7. The electronic device defined in claim 6, wherein the circuitry is further configured to generate a power amplifier bias voltage based on the calibration data and to provide the generated power amplifier bias voltage to the power amplifier circuitry.

8. The electronic device defined in claim 7, wherein the circuitry is further configured to generate control signals based on the calibration data and to provide the control signals to the radio-frequency transmitter circuitry.

9. The electronic device defined in claim 1, further comprising:
   additional radio-frequency receiver circuitry;
   radio-frequency front end circuitry coupled to the output of the power amplifier circuitry; and
   a receive path coupled between the radio-frequency front end circuitry and the additional radio-frequency receiver circuitry.

10. The electronic device defined in claim 9, further comprising:
    an antenna coupled to an output of the radio-frequency front end circuitry.

11. An electronic device, comprising:
    radio-frequency transmitter circuitry configured to transmit radio-frequency signals;
    power amplifier circuitry configured to amplify the transmitted radio-frequency signals;
    radio-frequency receiver circuitry coupled to an output of the power amplifier circuitry via a feedback path, wherein the radio-frequency receiver circuitry is configured to generate performance metric data based on the amplified radio-frequency signals;
    processing circuitry configured to generate calibration data for the power amplifier circuitry based on the performance metric data generated by the radio-frequency receiver circuitry, and the radio-frequency receiver circuitry comprises:
    Fourier transform circuitry, wherein the Fourier transform circuitry is configured to generate a Fourier transform of the amplified radio-frequency signals and to generate a receive band noise floor value based on the generated Fourier transform, and the processing circuitry is configured to generate the calibration data for the power amplifier circuitry based on the generated receive band noise floor value.

12. A method for calibrating envelope tracking circuitry in an electronic device having wireless communications circuitry, wherein the wireless communications circuitry comprises power amplifier circuitry that is powered by the envelope tracking circuitry, the method comprising, with processing circuitry on the electronic device:
    instructing the wireless communications circuitry to transmit radio-frequency test signals;
    retrieving performance metric data gathered in response to the transmitted radio-frequency test signals from the wireless communications circuitry;
    processing the retrieved performance metric data to generate calibration data that identifies a plurality of bias voltages for powering the power amplifier circuitry, wherein the retrieved performance metric data comprises a performance metric data structure having a plurality of entries;
    providing the calibration data to the envelope tracking circuitry;

with the processing circuitry, instructing a feedback receiver in the wireless communications circuitry to measure power amplifier compression values associated with the power amplifier circuitry based on the transmitted radio-frequency test signals, wherein each entry in the retrieved performance metric data structure includes a corresponding power amplifier compression value;

with the processing circuitry, selecting a power amplifier compression value; and with the processing circuitry, filtering out entries from the performance metric data structure having power amplifier compression values that are different from the selected power amplifier compression value.

13. The method defined in claim 12, further comprising:
with the processing circuitry, instructing the wireless communications circuitry to measure output power levels of the transmitted radio-frequency test signals, wherein each entry in the retrieved performance metric data structure includes a corresponding output power level measured by the wireless communications circuitry;

with the processing circuitry, selecting an output power level; and with the processing circuitry, filtering out entries from the performance metric data structure having output power levels that are different from the selected output power level.

14. The method defined in claim 13, further comprising:
with the processing circuitry, instructing the wireless communications circuitry to measure adjacent channel leakage ratio values from the transmitted radio-frequency test signals, wherein each entry in the retrieved performance metric data structure includes a corresponding adjacent channel leakage ratio value measured by the wireless communications circuitry;

with the processing circuitry, comparing the retrieved performance metric data to a predetermined adjacent channel leakage ratio threshold level; and with the processing circuitry, filtering out entries from the performance metric data structure having an adjacent channel leakage ratio value that is greater than the predetermined adjacent channel leakage ratio threshold level.

15. The method defined in claim 14, further comprising:
with the processing circuitry, instructing the feedback receiver to measure receive band noise floor values based on the transmitted radio-frequency test signals, wherein each entry in the retrieved performance metric data structure includes a corresponding receive band noise floor value;

with the processing circuitry, comparing the retrieved performance metric data to a predetermined receive band noise floor threshold level; and with the processing circuitry, filtering out entries from the performance metric data structure having a receive band noise floor value that is greater than the predetermined receive band noise floor threshold level.

16. The method defined in claim 14, wherein each entry in the retrieved performance metric data structure includes a corresponding bias voltage with which the radio-frequency test signals were transmitted, wherein the calibration data comprises a calibration data structure having a plurality of entries, the method further comprising:

selecting a minimum bias voltage from the performance metric data structure and storing the minimum bias voltage as a given entry in the plurality of entries of the calibration data structure.

17. The method defined in claim 12, wherein instructing the wireless communications circuitry to transmit the radio-frequency test signals comprises:
with the power amplifier circuitry, amplifying the radio-frequency test signals; and with the power amplifier circuitry, sweeping through a plurality of different transmit voltage levels of the radio-frequency test signals while amplifying the radio-frequency test signals.

18. An electronic device, comprising:
radio-frequency transmitter circuitry configured to transmit radio-frequency signals;
power amplifier circuitry configured to amplify the transmitted radio-frequency signals;
radio-frequency receiver circuitry coupled to an output of the power amplifier circuitry via a feedback path, wherein the radio-frequency receiver circuitry is configured to generate performance metric data based on the amplified radio-frequency signals;
processing circuitry configured to generate calibration data for the power amplifier circuitry based on the performance metric data generated by the radio-frequency receiver circuitry;
baseband processing circuitry that is coupled to the processing circuitry and that generates baseband data;
digital predistortion circuitry coupled between an output of the baseband processing circuitry and an input of the radio-frequency transmitter circuitry, wherein the digital predistortion circuitry performs digital predistortion operations on the baseband data based on a set of digital predistortion coefficients; and
circuitry configured to generate the digital predistortion coefficients based on the calibration data and to provide the digital predistortion coefficients to the digital predistortion circuitry, wherein the circuitry is further configured to generate radio-frequency gain index control signals based on the calibration data and to provide the radio-frequency gain index control signals to the radio-frequency transmitter circuitry to control a radio-frequency gain index provided to the transmitted radio-frequency signals by the radio-frequency transmitter circuitry.

19. An electronic device, comprising:
radio-frequency transmitter circuitry configured to transmit radio-frequency signals;
power amplifier circuitry configured to amplify the transmitted radio-frequency signals;
radio-frequency receiver circuitry coupled to an output of the power amplifier circuitry via a feedback path, wherein the radio-frequency receiver circuitry is configured to generate performance metric data based on the amplified radio-frequency signals;
processing circuitry configured to generate calibration data for the power amplifier circuitry based on the performance metric data generated by the radio-frequency receiver circuitry;
baseband processing circuitry that is coupled to the processing circuitry and that generates baseband data; and
digital predistortion circuitry coupled between an output of the baseband processing circuitry and an input of the radio-frequency transmitter circuitry, wherein the digital predistortion circuitry performs digital predistortion operations on the baseband data based on a set of digital predistortion coefficients, and the digital predistortion circuitry is coupled to the output of the power amplifier circuitry via the feedback path.

* * * * *